US012575435B2

(12) United States Patent
Lee

(10) Patent No.: US 12,575,435 B2
(45) Date of Patent: Mar. 10, 2026

(54) SEMICONDUCTOR PACKAGES AND METHOD OF MANUFACTURING THE SAME

(71) Applicant: SAMSUNG ELECTRONICS CO., LTD., Suwon-si (KR)

(72) Inventor: Jiyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 608 days.

(21) Appl. No.: 18/074,007

(22) Filed: Dec. 2, 2022

(65) Prior Publication Data

US 2023/0178470 A1     Jun. 8, 2023

(30) Foreign Application Priority Data

Dec. 6, 2021     (KR) ........................ 10-2021-0173177

(51) Int. Cl.
| | |
|---|---|
| *H01L 23/48* | (2006.01) |
| *H01L 21/48* | (2006.01) |
| *H01L 21/56* | (2006.01) |
| *H01L 23/31* | (2006.01) |
(Continued)

(52) U.S. Cl.
CPC .... *H01L 23/49838* (2013.01); *H01L 21/4846* (2013.01); *H01L 21/56* (2013.01); *H01L 23/3128* (2013.01); *H01L 23/49822* (2013.01); *H01L 24/13* (2013.01); *H01L 24/16* (2013.01); *H01L 2224/13124* (2013.01); *H01L 2224/13139* (2013.01); *H01L 2224/13147* (2013.01);
(Continued)

(58) Field of Classification Search
None
See application file for complete search history.

(56) References Cited

U.S. PATENT DOCUMENTS

| | | | |
|---|---|---|---|
| 8,975,726 B2 * | 3/2015 | Chen | ................. H01L 21/76885 |
| | | | 257/532 |
| 9,799,619 B2 | 10/2017 | Jin et al. | |
| 9,922,896 B1 | 3/2018 | Cheng et al. | |
(Continued)

FOREIGN PATENT DOCUMENTS

| | | |
|---|---|---|
| KR | 10-2016-0111297 A | 9/2016 |
| KR | 10-2018-0035572 A | 4/2018 |
(Continued)

OTHER PUBLICATIONS

First Office action dated Sep. 4, 2024 for corresponding TW Patent Application No. 111146776.

*Primary Examiner* — Nicholas J Tobergte
(74) *Attorney, Agent, or Firm* — Muir Patent Law, PLLC

(57) ABSTRACT

A semiconductor package is provided. The semiconductor package includes a first redistribution layer, a first semiconductor chip disposed on the first redistribution layer, a molding layer disposed on the first redistribution layer to cover a side surface of the first semiconductor chip, a second redistribution layer disposed on the molding layer, and a connecting pillar disposed to penetrate the molding layer and configured to connect the first redistribution layer to the second redistribution layer, the connecting pillar including a lower area having a first width in a first direction parallel to an upper surface of the first semiconductor chip and an upper area integrally connected to the lower area and having a second width that is less than the first width in the first direction.

18 Claims, 43 Drawing Sheets

2B

(51) Int. Cl.
  *H01L 23/498*        (2006.01)
  *H01L 23/00*         (2006.01)

(52) U.S. Cl.
  CPC ............... *H01L 2224/13155* (2013.01); *H01L 2224/13166* (2013.01); *H01L 2224/16227* (2013.01)

(56) References Cited

U.S. PATENT DOCUMENTS

| | | | |
|---|---|---|---|
| 10,115,647 | B2 | 10/2018 | Huang et al. |
| 11,018,068 | B2 | 5/2021 | Liu et al. |
| 11,043,410 | B2 | 6/2021 | Chen |
| 2015/0028471 | A1* | 1/2015 | Lin ......................... H01L 24/96 |
| | | | 257/737 |
| 2015/0371947 | A1* | 12/2015 | Chen ....................... H01L 24/25 |
| | | | 257/774 |
| 2019/0148330 | A1* | 5/2019 | Chen ................... H01L 23/5384 |
| | | | 257/774 |
| 2020/0135543 | A1 | 4/2020 | Wang et al. |
| 2020/0411445 | A1* | 12/2020 | Chen ................... H01L 23/5386 |
| 2021/0090973 | A1* | 3/2021 | Lee ....................... H01L 25/105 |
| 2021/0090984 | A1 | 3/2021 | Chun et al. |

FOREIGN PATENT DOCUMENTS

| | | |
|---|---|---|
| TW | 201409622 A | 3/2014 |
| TW | 201415586 A | 4/2014 |
| TW | 201633471 A | 9/2016 |
| TW | 202129829 A | 8/2021 |

* cited by examiner

SEMICONDUCTOR PACKAGES AND METHOD OF MANUFACTURING THE SAME

CROSS-REFERENCE TO RELATED APPLICATION

This application is based on and claims priority under 35 U.S.C. § 119 to Korean Patent Application No. 10-2021-0173177, filed on Dec. 6, 2021, in the Korean Intellectual Property Office, the disclosure of which is incorporated by reference herein in its entirety.

BACKGROUND

1. Field

Embodiments relate to a semiconductor package and a method of manufacturing the same.

2. Description of the Related Art

Fan-out wafer-level packages are manufactured by packaging semiconductor chips using redistribution layers instead of printed circuit boards. A redistribution layer may be formed to a thickness smaller than that of a printed circuit board, and may have a relatively miniaturized footprint.

SUMMARY

An embodiment is directed to a semiconductor package, including: a first redistribution layer; a first semiconductor chip disposed on the first redistribution layer; a molding layer disposed on the first redistribution layer to cover a side surface of the first semiconductor chip; a second redistribution layer disposed on the molding layer; and a connecting pillar disposed to penetrate the molding layer and configured to connect the first redistribution layer to the second redistribution layer, the connecting pillar including a lower area having a first width in a first direction parallel to an upper surface of the first semiconductor chip and an upper area integrally connected to the lower area and having a second width that is less than the first width in the first direction.

An embodiment is directed to a semiconductor package, including: a first redistribution layer; a first semiconductor chip disposed on the first redistribution layer; a molding layer disposed on the first redistribution layer to cover a side surface of the first semiconductor chip; a second redistribution layer disposed on the molding layer; and a connecting pillar disposed to penetrate the molding layer and configured to connect the first redistribution layer to the second redistribution layer, the connecting pillar including an upper area and a lower area, wherein a stepped portion is defined in an outer portion of the connecting pillar at a boundary between the upper area and the lower area.

An embodiment is directed to a semiconductor package, including: a first redistribution layer; a first semiconductor chip disposed on the first redistribution layer; a molding layer disposed on the first redistribution layer to cover a side surface of the first semiconductor chip; a second redistribution layer disposed on the molding layer; and a connecting pillar disposed to penetrate the molding layer and configured to connect the first redistribution layer to the second redistribution layer, the connecting pillar including an upper area and a lower area, wherein a stepped portion is defined in an outer portion of the connecting pillar at a boundary between the upper area and the lower area; and an external connection terminal disposed on a lower surface of the first redistribution layer, wherein the connecting pillar includes copper.

An embodiment is directed to a semiconductor package, including: a first redistribution layer; a first semiconductor chip disposed on the first redistribution layer; a molding layer disposed on the first redistribution layer to cover a side surface of the first semiconductor chip; a second redistribution layer disposed on the molding layer; and a connecting pillar disposed to penetrate the molding layer and configured to connect the first redistribution layer to the second redistribution layer, the connecting pillar including a lower area having a first width in a first direction parallel to an upper surface of the first semiconductor chip and an upper area integrally connected to the lower area and having a second width that is greater than the first width in the first direction.

An embodiment is directed to a semiconductor package, including: a first redistribution layer; a first semiconductor chip disposed on the first redistribution layer; a molding layer disposed on the first redistribution layer to cover a side surface of the first semiconductor chip; a second redistribution layer disposed on the molding layer; a connecting pillar disposed to penetrate the molding layer and configured to connect the first redistribution layer to the second redistribution layer, the connecting pillar including a lower area having a first width in a first direction parallel to an upper surface of the first semiconductor chip and an upper area integrally connected to the lower area and having a second width that is greater than the first width in the first direction; and an external connection terminal disposed on a lower surface of the first redistribution layer, wherein the connecting pillar includes copper.

An embodiment is directed to a manufacturing method of semiconductor package, the method including: forming a first redistribution layer on a first carrier substrate; forming a photoresist material layer on the first redistribution layer; forming an opening having a stepped portion by performing an exposure process on the photoresist material layer using a phase shift mask including a first area, a second area, and a third area, wherein the first area is an area that transmits light of a first wavelength, the second area is an area that does not transmit light of the first wavelength, and the third area is an area that partially transmits the light of the first wavelength; forming a connecting pillar in the opening; and removing the photoresist material layer.

An embodiment is directed to a manufacturing method of semiconductor package, the method including: forming a first redistribution layer on a first carrier substrate; forming a photoresist material layer on the first redistribution layer; forming an opening having a stepped portion by performing an exposure process on the photoresist material layer using a phase shift mask including a first area, a second area, and a third area, wherein the first area is an area that transmits light of a first wavelength, the second area is an area that does not transmit light of the first wavelength, and the third area is an area that partially transmits the light of the first wavelength, wherein the opening is formed at a position that vertically overlaps with the second area; forming a connecting pillar in the opening; and removing the photoresist material layer.

An embodiment is directed to a manufacturing method of semiconductor package, the method including: forming a first redistribution layer on a first carrier substrate; forming a photoresist material layer on the first redistribution layer; forming an opening having a stepped portion by performing an exposure process on the photoresist material layer using a phase shift mask including a first area, a second area, and a third area, wherein the first area is an area that transmits light of a first wavelength, the second area is an area that does not transmit light of the first wavelength, and the third area is an area that partially transmits the light of the first wavelength, wherein the opening is formed at a position that vertically overlaps with the first area; forming a connecting pillar in the opening; and removing the photoresist material layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
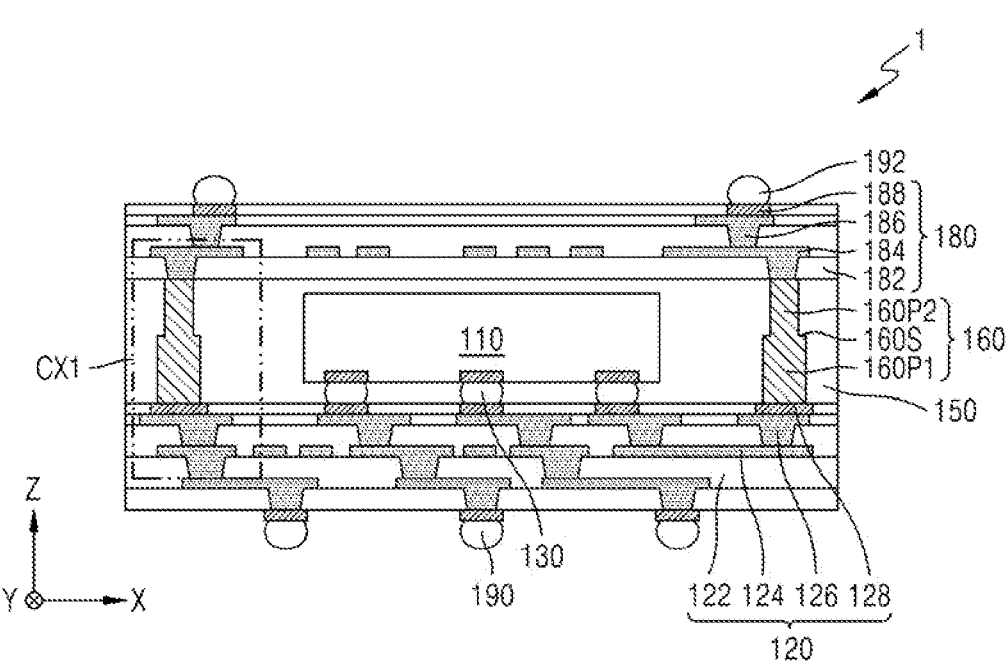
FIG. 1 is a cross-sectional view illustrating a semiconductor package according to some example embodiments.
Figure 2:
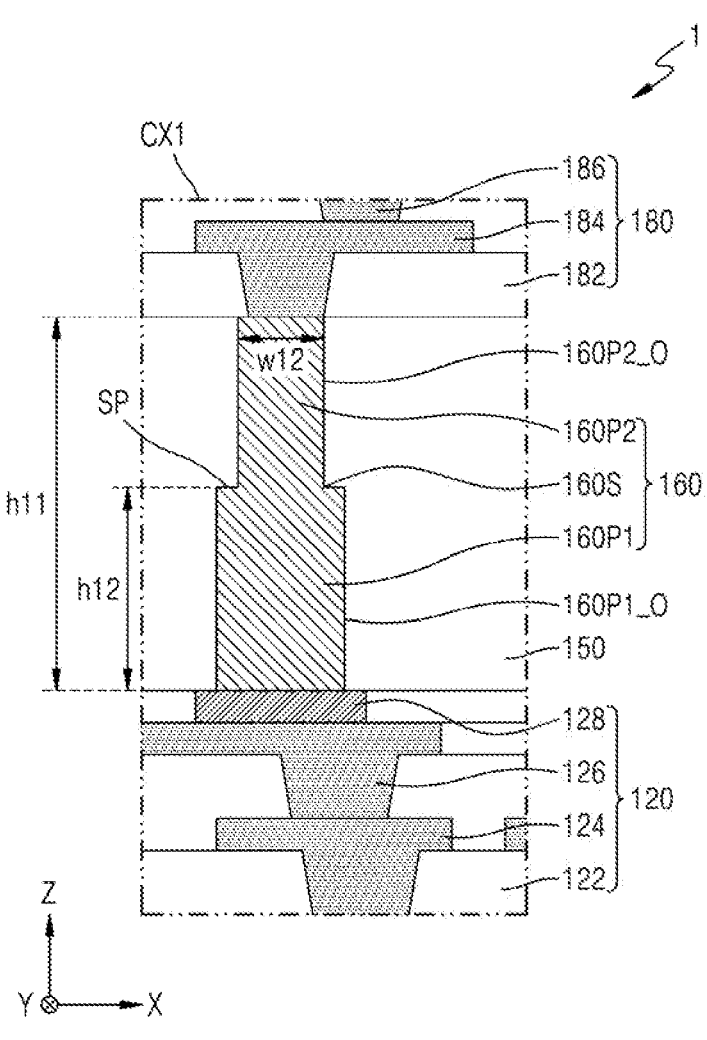
FIG. 2 is an enlarged view of a portion CX1 of FIG. 1.
Figure 3:
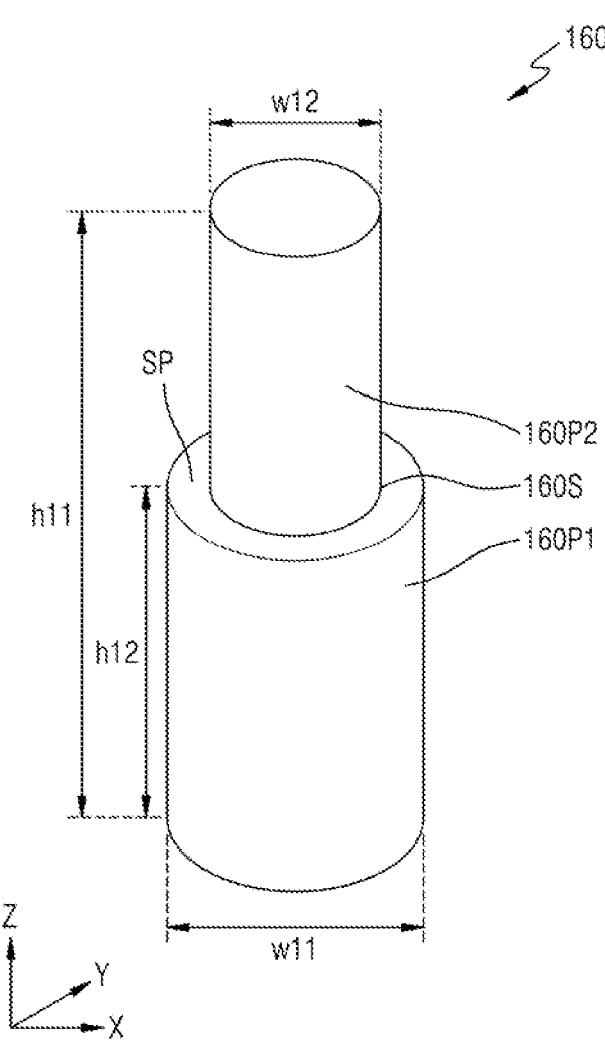
FIG. 3 is a perspective view schematically illustrating a connecting pillar of FIG. 2.
Figure 4:
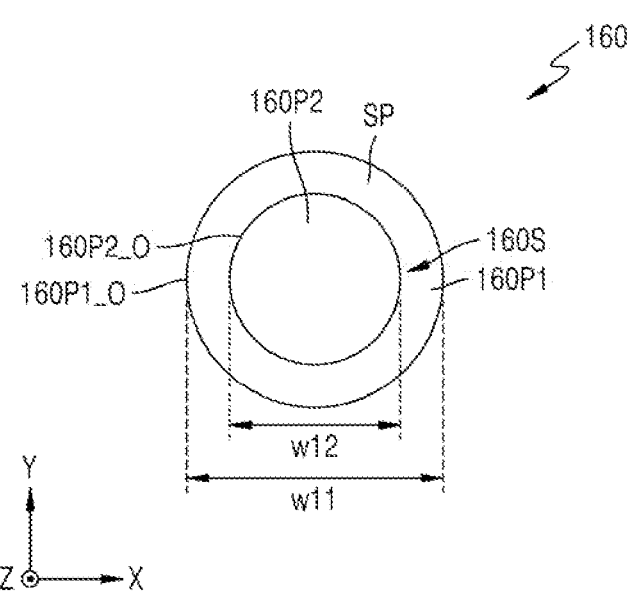
FIG. 4 is a top view illustrating the connecting pillar of FIG. 2.

FIG. 1 is a cross-sectional view illustrating a semiconductor package 1 according to some example embodiments. FIG. 2 is an enlarged view of a portion CX1 of FIG. 1. FIG. 3 is a perspective view schematically illustrating a connecting pillar 160 of FIG. 2. FIG. 4 is a top view illustrating the connecting pillar 160 of FIG. 2.

Referring to FIGS. 1 to 4, the semiconductor package 1 may include a semiconductor chip 110, a first redistribution layer 120, a connection bump 130, a molding layer 150, the connecting pillar 160, a second redistribution layer 180, and an external connection terminal 190.

The semiconductor chip 110 may be disposed on the first redistribution layer 120. For example, the semiconductor chip 110 may be mounted on the first redistribution layer 120 in a flip chip method. The semiconductor chip 110 may be a memory chip or a logic chip. The memory chip may be, for example, a volatile memory chip such as dynamic random access memory (DRAM) or static random access memory (SRAM), or may be a non-volatile memory chip such as phase-change random access memory (PRAM), magnetoresistive random access memory (MRAM), ferroelectric random access memory (FeRAM), or resistive random access memory (RRAM). Also, the logic chip may be, for example, a microprocessor, an analog device, or a digital signal processor.

The semiconductor chip 110 may include, for example, silicon (Si). In another implementation, the semiconductor chip 110 may include a semiconductor element, such as germanium (Ge), or a compound semiconductor, such as silicon carbide (SiC), gallium arsenide (GaAs), indium arsenide (InAs), and indium phosphide (InP). The semiconductor chip 110 may have an active surface, and an inactive surface opposite to the active surface. The active surface of the semiconductor chip 110 may face the first redistribution layer 120. A semiconductor device including a plurality of individual devices of various types may be formed on the active surface of the semiconductor chip 110. For example, a plurality of the individual devices may include various microelectronic devices, for example, metal-oxide-semiconductor field effect transistors (MOSFETs) such as complementary metal-oxide-semiconductor (CMOS) transistors, system large scale integration (LSI), image sensors, such as CMOS imaging sensors (CISs), micro-electro-mechanical systems (MEMS), active devices, passive devices, and the like.

In an example embodiment, the semiconductor package 1 is a semiconductor package having a fan-out structure, and the footprint of the semiconductor chip 110 may be less than that of the first redistribution layer 120. Thus, at least one of a plurality of external connection terminals 190 may be disposed at a position spaced apart from the side surface of the semiconductor chip 110 to the outer portion of the semiconductor chip 110.

The semiconductor package 1 may include a plurality of semiconductor chips. For example, the semiconductor package 1 may include two or more semiconductor chips. The plurality of semiconductor chips may be the same type of semiconductor chips or different types of semiconductor chips. The semiconductor package 1 may be a System In Package (SIP) in which different types of semiconductor chips are electrically connected to each other and operate as one system.

The first redistribution layer 120 may include a first insulating layer 122, a first redistribution pattern 124, a first via 126, and a first pad 128. The semiconductor chip 110, the molding layer 150, and the connecting pillar 160 may be disposed on the upper surface of the first redistribution layer 120. The external connection terminal 190 may be disposed on the lower surface of the first redistribution layer 120.

The first insulating layer 122 may include an insulating material, for example, at least one of photosensitive insulating materials, such as Photo Imageable Dielectric (PID), thermosetting resins, such as epoxy resins, thermoplastic resins such as polyimide, or resins impregnated into a core material, such as glass fiber together with an inorganic filler. The first insulating layer 122 may include a plurality of layers. In this case, the materials constituting the plurality of layers may be the same as each other, or may be different from each other.

The first redistribution pattern 124 may be disposed on each of the plurality of layers constituting the first insulating layer 122, and the first vias 126 may be disposed to connect to each other the first redistribution patterns 124 disposed at different vertical levels. The first pad 128 may be disposed between the first redistribution pattern 124 and the connecting pillar 160.

In some example embodiments, the first redistribution pattern 124, the first via 126, and the first pad 128 may include at least one of copper (Cu), aluminum (Al), silver (Ag), titanium (Ti), and nickel (Ni). The first via 126 may include an upper surface disposed close to the connecting pillar 160 or the semiconductor chip 110, and a lower surface disposed far from the connecting pillar 160 or the semiconductor chip 110. The width of the upper surface of the first via 126 may be formed to be greater than the width of the lower surface of the first via 126.

The connection bump 130 may be disposed between the semiconductor chip 110 and the first pad 128. The connection bump 130 may include a conductive material for electrically connecting the semiconductor chip 110 to the first redistribution layer 120, for example, at least one of copper (Cu), aluminum (Al), silver (Ag), titanium (Ti), and nickel (Ni). The connection bump 130 may include, for example, at least one of a pillar structure, a solder bump, a solder ball, and a solder layer. There may be a plurality of connection bumps 130.

The molding layer 150 may cover the semiconductor chip 110 on the first redistribution layer 120. The molding layer 150 may include, for example, at least one of an epoxy molding compound (EMC), a resin, and silica. The molding layer 150 may include a plurality of layers. For example, a first layer of the molding layer 150 may directly cover the semiconductor chip 110 and the first redistribution layer 120, and one or more layers disposed on the upper surface of the first layer may serve as warpage control. In this case, the plurality of layers may be made of the same material as each other, or may be made of different materials.

The connecting pillar 160 may be disposed between the first redistribution layer 120 and the second redistribution layer 180, and may penetrate the molding layer 150 in a vertical direction (Z direction). The connecting pillar 160 may include a conductive material for electrically connecting the first redistribution layer 120 to the second redistribution layer 180, for example, at least one of copper (Cu), aluminum (Al), silver (Ag), titanium (Ti), and nickel (Ni). In some example embodiments, the connecting pillar 160 may include copper.

The connecting pillar 160 may include a lower area 160P1, an upper area 160P2, and a stepped portion 160S. The lower area 160P1 may refer to the lower side of the connecting pillar 160, and the upper area 160P2 may refer to the upper side of the connecting pillar 160 integrally connected to the lower area 160P1, and the stepped portion 160S may be defined in the outer portion of the connecting pillar 160 between the lower area 160P1 and the upper area 160P2.

Referring to FIG. 3, the lower area 160P1 may have a first width w11 in a first direction X parallel to the upper surface of the semiconductor chip 110, and the upper area 160P2 may have a second width w12 that is less than the first width w11 in the first direction X. In some examples, the first width w11 may range from about 50 micrometers to about 300 micrometers, and the second width w12 may range from about 40 micrometers to about 200 micrometers.

The connecting pillar 160 may have a first height h11 in the vertical direction Z. The lower area 160P1 may have a second height h12 in the vertical direction Z. For example, the first height h11 may be in a range of about 100 micrometers to about 400 micrometers, and the second height h12 may be in a range of about 30% to about 70% of the first height h11. In some example embodiments, the aspect ratio of the connecting pillar 160, that is, the ratio of the first height h11 to the first width w11, may be in a range of about 0.5 to about 5.

Referring to FIGS. 3 and 4, the lower area 160P1 may have a circular or elliptical horizontal cross-section, and the upper area 160P2 may have a circular or elliptical horizontal cross-section. However, the horizontal cross-sectional shape of the lower area 160P1 and the upper area 160P2 may be varied, and the lower area 160P1 and the upper area 160P2 may have horizontal cross-sections of various shapes, such as a triangle, a square, a round square, a rhombus, and a polygon.

Referring to FIGS. 3 and 4, the upper area 160P2 may be entirely arranged to vertically overlap with the lower area 160P1, and in a plan view, an outer portion wall 160P1_O of the lower area 160P1 may surround an outer portion wall 160P2_O of the upper area 160P2. For example, the lower area 160P1 may include a shoulder portion SP in the outer portion of the lower area 160P1. The shoulder portion SP may refer to a flat upper surface of the lower area 160P1 that is not covered by the upper area 160P2. The molding layer 150 may cover the entirety of the outer portion wall 160P1_O of the lower area 160P1 of the connecting pillar 160, the stepped portion 160S, and the outer portion wall 160P2_O of the upper area 160P2, and may be in contact with the shoulder portion SP.

The second redistribution layer 180 may include a second insulating layer 182, a second redistribution pattern 184, a second via 186, and a second pad 188. The second redistribution layer 180 may be disposed on the molding layer 150 and the connecting pillar 160.

The second insulating layer 182 may include an insulating material, for example, at least one of photosensitive insulating materials, such as PID, thermosetting resins, such as epoxy resins, thermoplastic resins, such as polyimide, or resins impregnated into a core material, such as glass fiber together with an inorganic filler. The second insulating layer 182 may include a plurality of layers. In this case, the materials constituting the plurality of layers may be the same as each other, or may be different from each other.

The plurality of second redistribution patterns 184 may be disposed on each of the plurality of layers constituting the second insulating layer 182. The second via 186 may be disposed to connect to each other the second redistribution patterns 184 disposed at different vertical levels. The second pad 188 may be disposed on the second redistribution pattern 184 disposed uppermost.

In some example embodiments, the second redistribution pattern 184, the second via 186, and the second pad 188 may include at least one of copper (Cu), aluminum (Al), silver (Ag), titanium (Ti), and nickel (Ni). The second via 186 may include a lower surface disposed close to the connecting pillar 160 or the semiconductor chip 110 and an upper surface disposed far from the connecting pillar 160 or the semiconductor chip 110. The width of the upper surface of the second via 186 may be formed to be greater than the width of the lower surface of the second via 186.

The external connection terminal 190 may be disposed on the lower surface of the first redistribution layer 120. The external connection terminal 190 may electrically connect the semiconductor package 1 to an external device, such as a system board or a main board. The external connection terminal 190 may be, for example, a solder ball, a bump, a pin, or a land. The external connection terminal 190 may include at least one of copper (Cu), aluminum (Al), silver (Ag), titanium (Ti), nickel (Ni), and tin (Sn). The external connection terminals 190 may be disposed in a fan-out structure. An interval between two adjacent external connection terminals 190 may be greater than an interval between two adjacent connection bumps 130.

In some example embodiments, the semiconductor package 1 may further include a connection member 192 disposed on the second pad 188 of the second redistribution layer 180. The connection member 192 may connect the semiconductor package 1 to another semiconductor package. The connecting member 192 may be made from, for example, solder balls. The connection member 192 may include at least one of copper (Cu), silver (Ag), gold (Au), and tin (Sn). The connection member 192 may be provided in plural.

In general, to form fan-out wafer level packages, after the first redistribution layer 120 is formed on a carrier substrate (not shown), and the connecting pillar 160 is first formed on the first redistribution layer 120, the semiconductor chip 110 is attached on the first redistribution layer 120, and the molding layer 150 and the second redistribution layer 180 are formed. To form the connecting pillar 160, a method of forming an opening by performing an exposure process on a photoresist material layer and forming the connecting pillar 160 inside the opening may be used. However, as the target aspect ratio of the opening increases, there is an issue in that a defect may occur in the opening forming process, such as not completely removing the photoresist material layer from the bottom of the opening.

According to example embodiments such a defect may be avoided. In an example embodiment, an opening 520H (see FIG. 31D) having a stepped portion 520S (see FIG. 31D) may be formed using a phase shift mask PM10 (see FIG. 31C) on a first photoresist material layer 520 (see FIG. 31C) having a negative photosensitivity characteristic, and the opening 520H is filled with a conductive material such that the connecting pillar 160 may be formed. Accordingly, a defect in the process of forming the opening 520H may be prevented. Thus, a connecting pillar 160 having a relatively small footprint, a relatively large height, and/or a relatively large aspect ratio may be formed.

In addition, as the connecting pillar 160 may include the stepped portion 160S between the lower area 160P1 and the upper area 160P2, and the molding layer 150 may surround the sidewall of the connecting pillar 160, such that a contact area between the molding layer 150 and the connecting pillar 160 may be relatively large. Therefore, even if a crack occurs between the lower area 160P1 of the connecting pillar 160 and the molding layer 150 (for example, due to a difference in the coefficient of thermal expansion between the connecting pillar 160 and the molding layer 150) in the manufacturing process of the semiconductor package 1, the crack may not propagate to the upper area 160P2 of the connecting pillar 160. Accordingly, the semiconductor package 1 may have excellent reliability.

Figure 5:
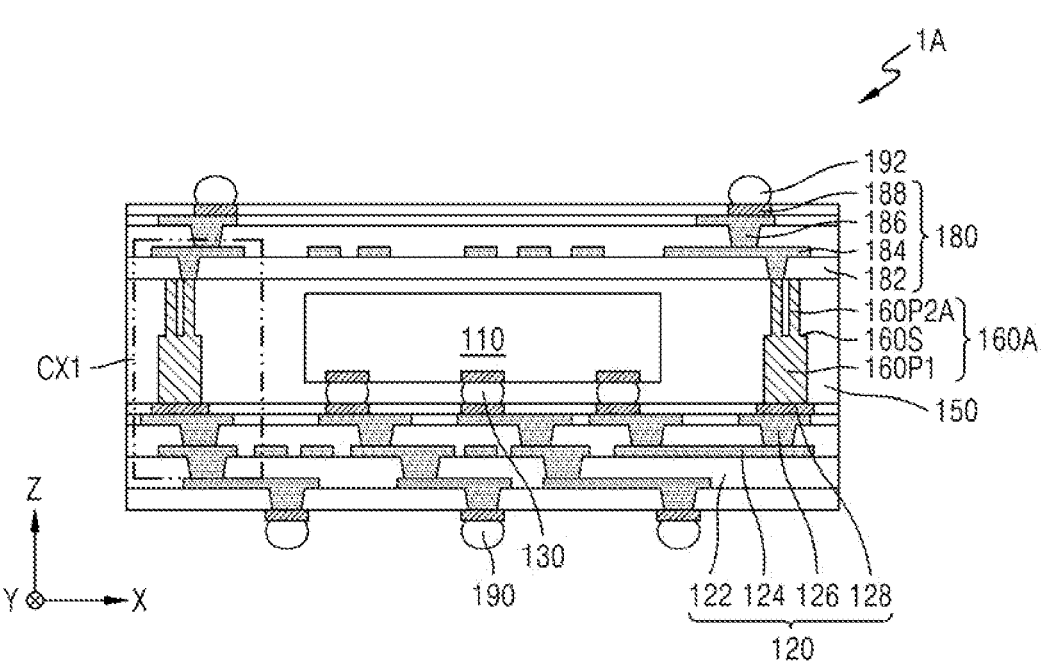
FIG. 5 is a cross-sectional view illustrating a semiconductor package according to some example embodiments.
Figure 6:
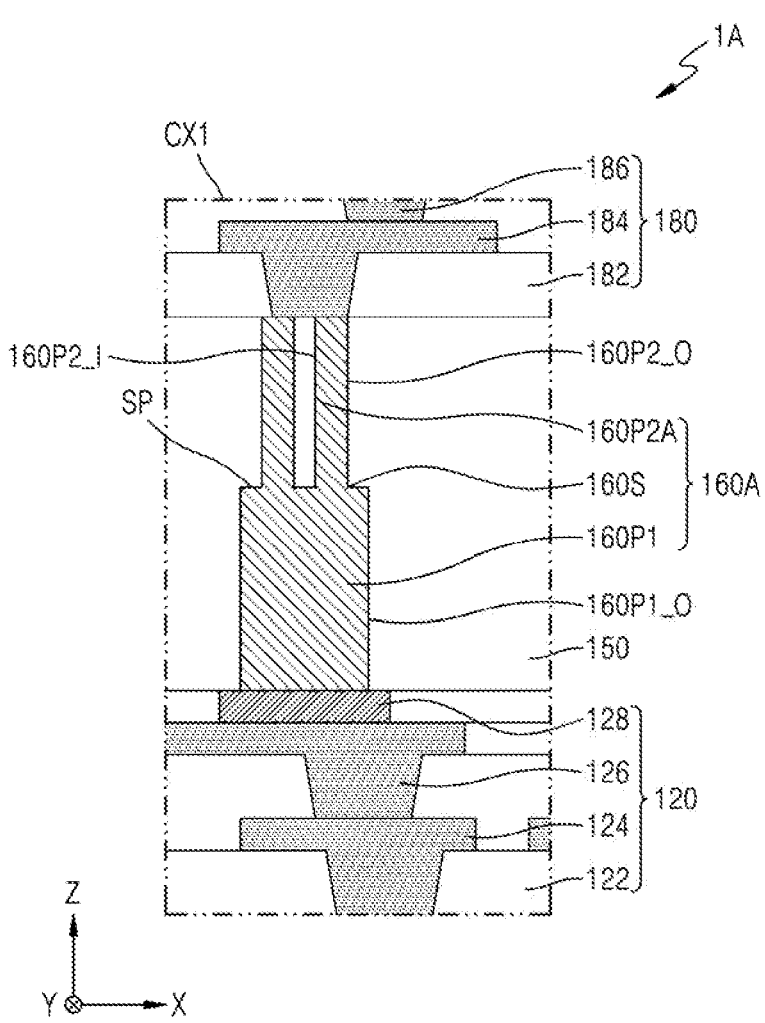
FIG. 6 is an enlarged view of a portion CX1 of FIG. 5.
Figure 7:
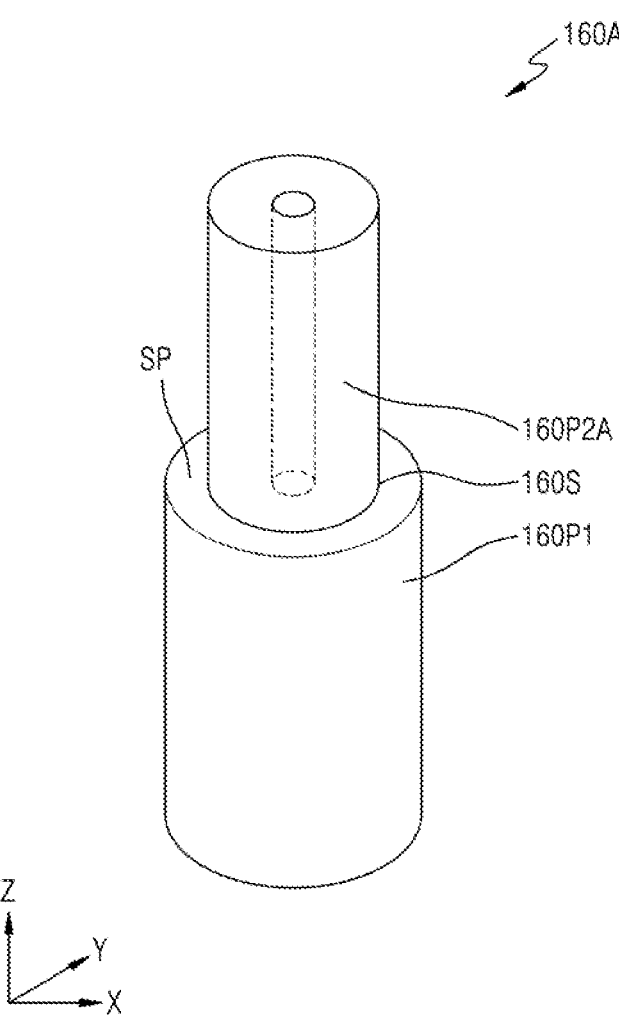
FIG. 7 is a perspective view schematically illustrating a connecting pillar of FIG. 6.
Figure 8:
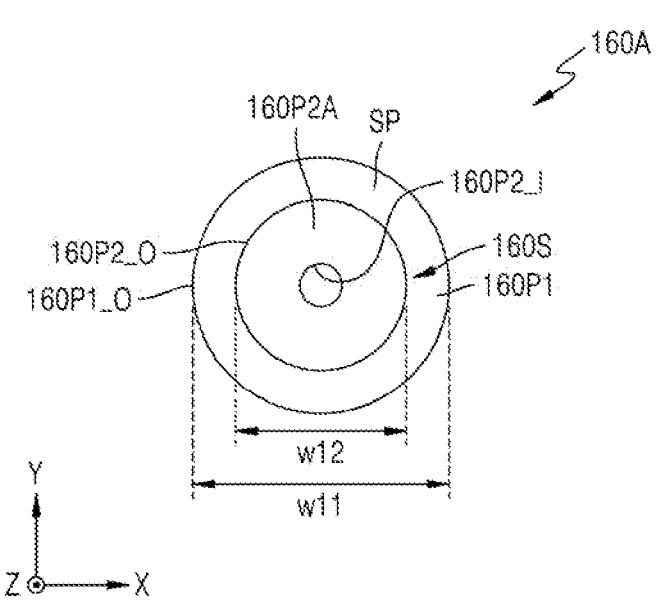
FIG. 8 is a top view illustrating the connecting pillar of FIG. 6.

FIG. 5 is a cross-sectional view illustrating a semiconductor package 1A according to some example embodiments. FIG. 6 is an enlarged view of a portion CX1 of FIG. 5. FIG. 7 is a perspective view schematically illustrating a connecting pillar 160A of FIG. 6. FIG. 8 is a top view illustrating the connecting pillar 160A of FIG. 6. In FIGS. 5 to 8, the same reference numerals as in FIGS. 1 to 4 indicate the same components.

Referring to FIGS. 5 to 8, the connecting pillar 160A may include the lower area 160P1, an upper area 160P2A, and the stepped portion 160S defined between the lower area 160P1 and the upper area 160P2A. The lower area 160P1 may have a circular or elliptical horizontal cross-section. The upper area 160P2A may have an annular horizontal cross-section, for example, may be at least partially hollow for at least part of the height thereof.

For example, the upper area 160P2A may include the outer portion wall 160P2_O and an inner wall 160P2_I. The outer portion wall 160P2_O and the inner wall 160P2_I may be spaced apart from each other to have a substantially constant distance in a radial direction, for example, in an X-Y plane. Referring to FIG. 8, in a plan view, the outer portion wall 160P1_O of the lower area 160P1 may surround the outer portion wall 160P2_O of the upper area 160P2A, and the outer portion wall 160P2_O of the upper area 160P2A may surround the inner wall 160P2_I of the upper area 160P2A.

According to some example embodiments, the opening 520H (see FIG. 31D) having a stepped portion 520S (see FIG. 31D) may be formed using the phase shift mask PM10 (see FIG. 31C) on the first photoresist material layer 520 (see FIG. 31C) having a negative photosensitivity characteristic, and the opening 520H may be filled with a conductive material such that the connecting pillar 160A may be formed. Accordingly, a defect in the opening forming process may be prevented, and thus, for example, a connecting pillar 160A having a relatively small footprint, a relatively large height, and/or a relatively large aspect ratio may be formed.

In addition, the contact area between the molding layer 150 and the connecting pillar 160A may be relatively large. Therefore, even if a crack occurs between the lower area 160P1 of the connecting pillar 160A and the molding layer 150 in the manufacturing process of the semiconductor package 1A, the crack may not propagate to the upper area 160P2A of the connecting pillar 160A. Accordingly, the semiconductor package 1A may have excellent reliability.

Figure 9:
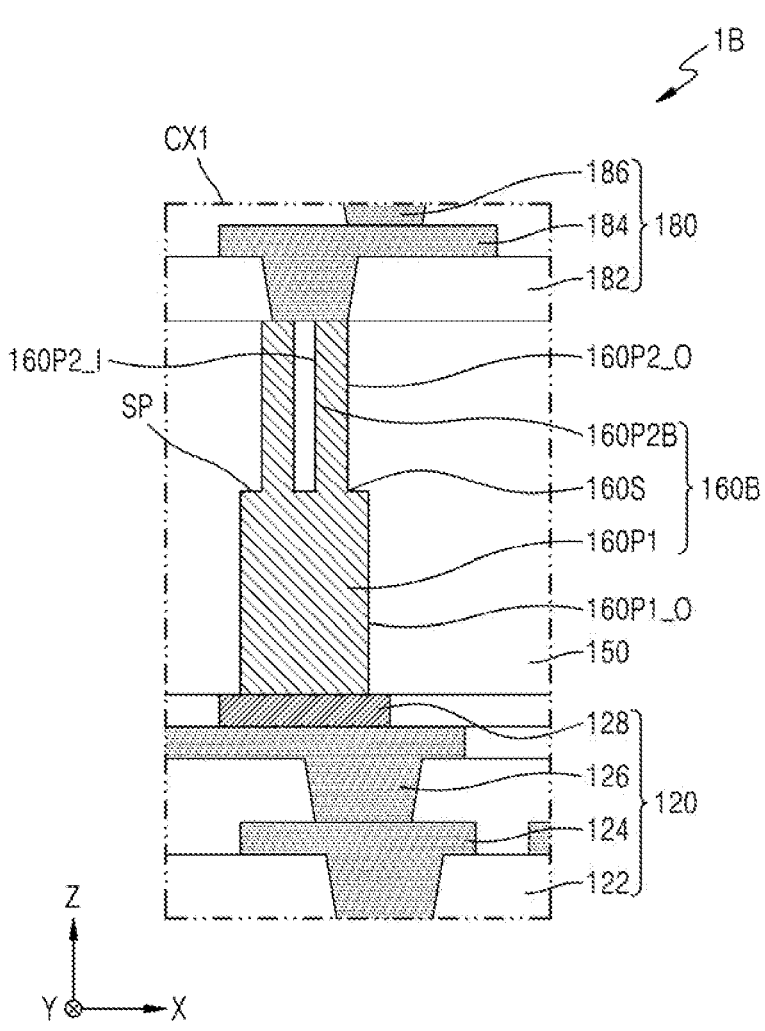
FIG. 9 is a cross-sectional view illustrating a semiconductor package according to some example embodiments.
Figure 10:
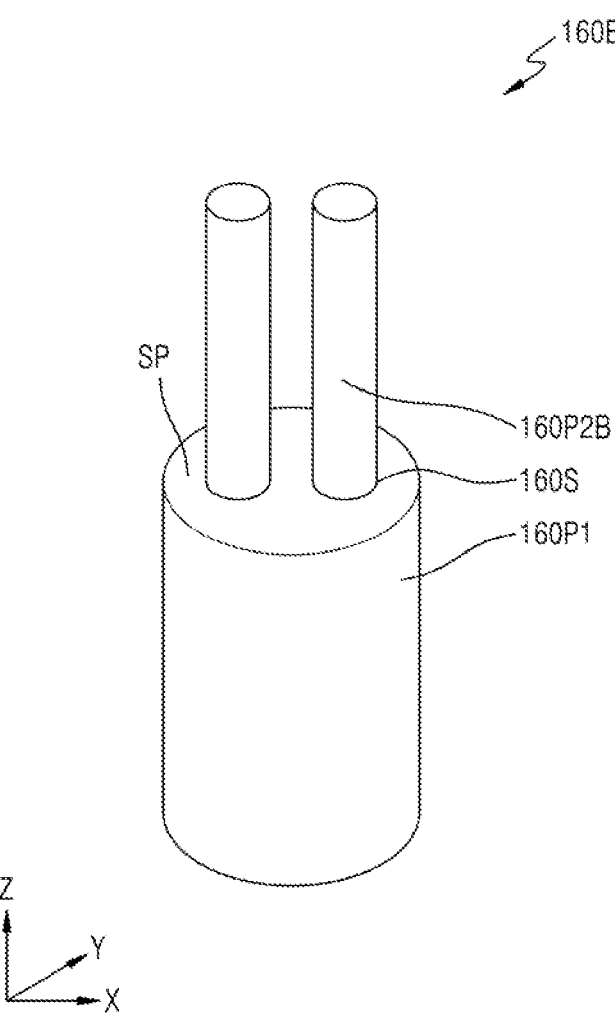
FIG. 10 is a perspective view schematically illustrating a connecting pillar of FIG. 9.
Figure 11:
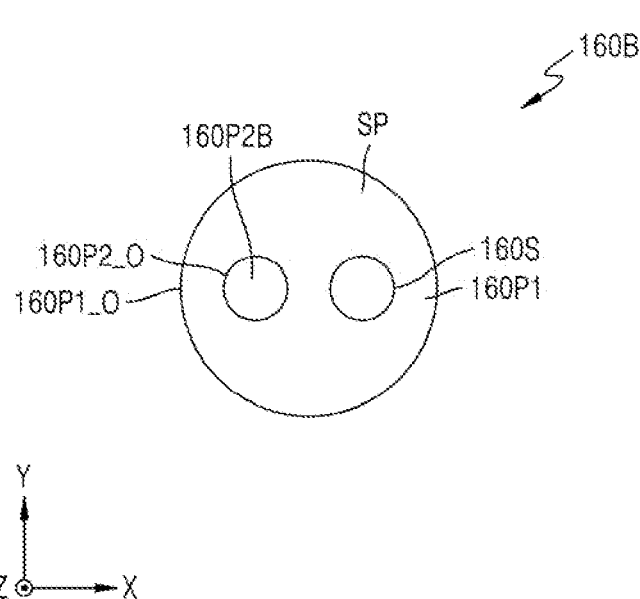
FIG. 11 is a top view illustrating the connecting pillar of FIG. 9.

FIG. 9 is a cross-sectional view illustrating a semiconductor package 1B according to some example embodiments. FIG. 10 is a perspective view schematically illustrating the connecting pillar 160B of FIG. 9. FIG. 11 is a top view illustrating the connecting pillar 160B of FIG. 9. In FIGS. 9 to 11, the same reference numerals as in FIGS. 1 to 8 indicate the same components.

Referring to FIGS. 9 to 11, a connecting pillar 160B may include the lower area 160P1, at least two upper areas 160P2B, and a stepped portion 160S defined between the lower area 160P1 and the at least two upper areas 160P2B. The at least two upper areas 160P2B may be disposed to be spaced apart from each other on the lower area 160P1.

Referring to, for example, FIG. 10, the lower area 160P1 may have a circular or elliptical horizontal cross-section, and each of the at least two upper areas 160P2B may have a circular or elliptical horizontal cross-section. However, the horizontal cross-sectional shape of the lower area 160P1 and the upper area 160P2B may be varied, and the lower area 160P1 and the upper area 160P2B may have horizontal cross-sections of various shapes, such as a triangle, a square, a round square, a rhombus, and a polygon.

The molding layer 150 may cover the entirety of the sidewall of the lower area 160P1, the stepped portion 160S, and the sidewalls of the at least two upper areas 160P2B. Accordingly, a relatively large contact area may be secured between the molding layer 150 and the connecting pillar 160B.

Figure 12:
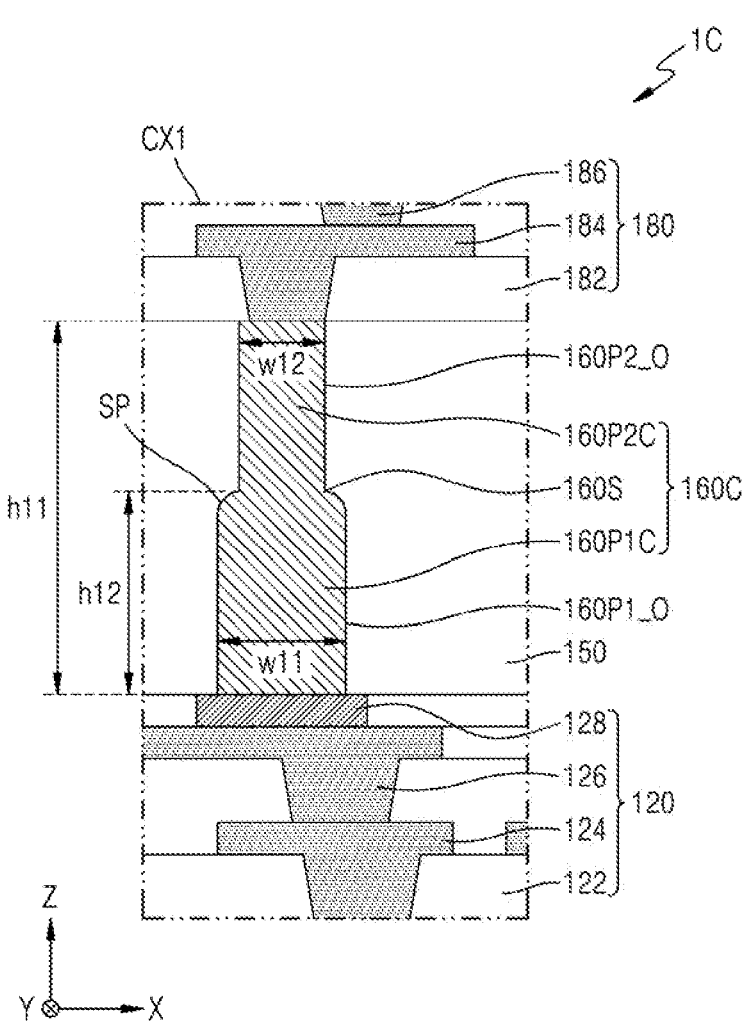
FIG. 12 is a cross-sectional view illustrating a semiconductor package according to some example embodiments.

FIG. 12 is a cross-sectional view illustrating a semiconductor package 1C according to some example embodiments. In FIG. 12, the same reference numerals as in FIGS. 1 to 11 denote the same components.

Referring to FIG. 12, a connecting pillar 160C may have a stepped portion 160S gently extending between a lower area 160P1C and an upper area 160P2C. In addition, at least a portion of the outer portion wall 160P1_O of the lower area 160P1C adjacent to the stepped portion 160S may be a curved sidewall, and at least a portion of the outer portion wall 160P2_O of the upper area 160P2C adjacent to the stepped portion 160S may be a curved sidewall.

Figure 13:
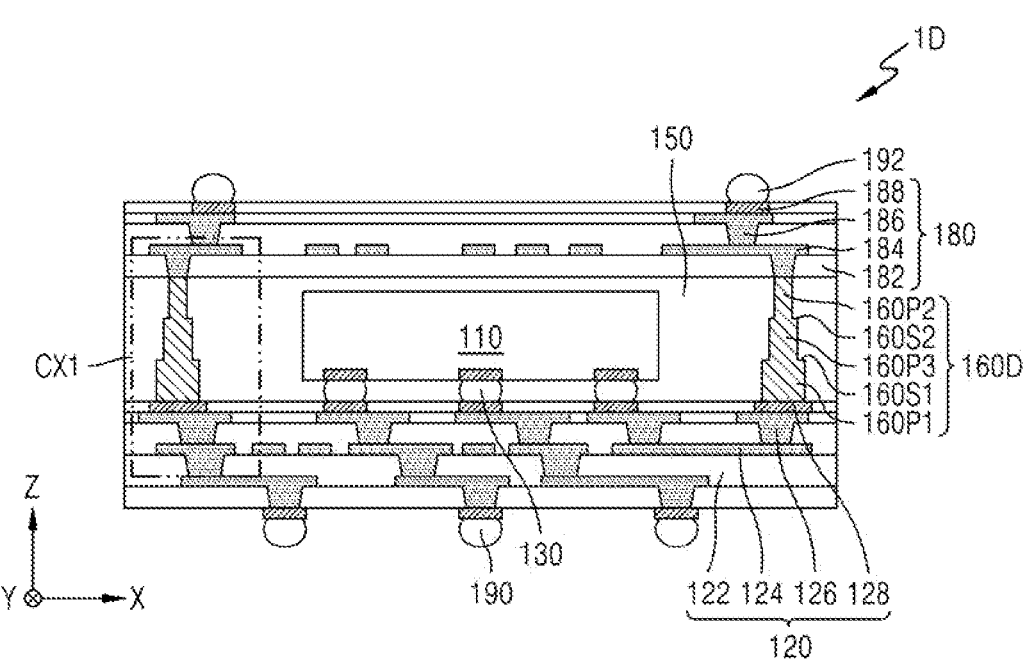
FIG. 13 is a cross-sectional view illustrating a semiconductor package according to some example embodiments.
Figure 14:
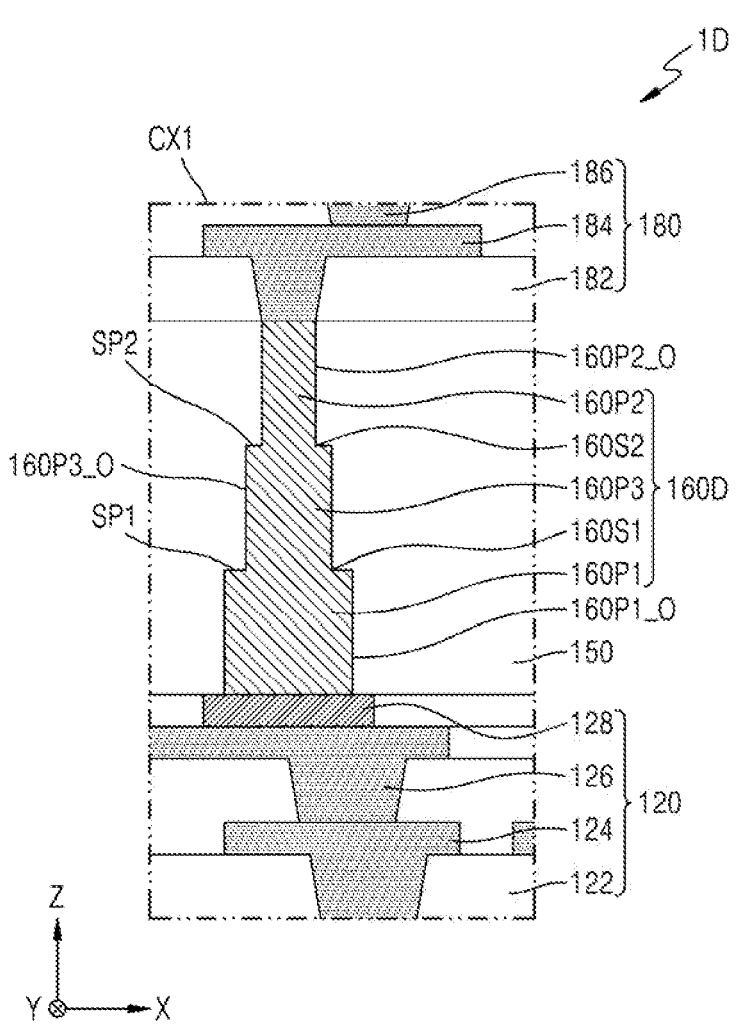
FIG. 14 is an enlarged view of a portion CX1 of FIG. 13.
Figure 15:
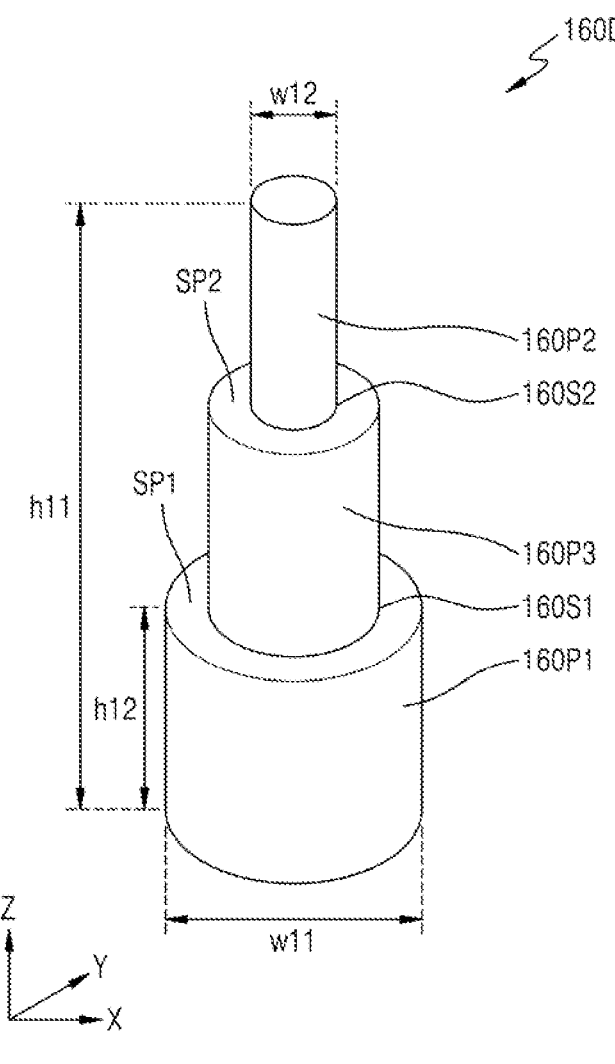
FIG. 15 is a perspective view schematically illustrating a connecting pillar of FIG. 14.
Figure 16:
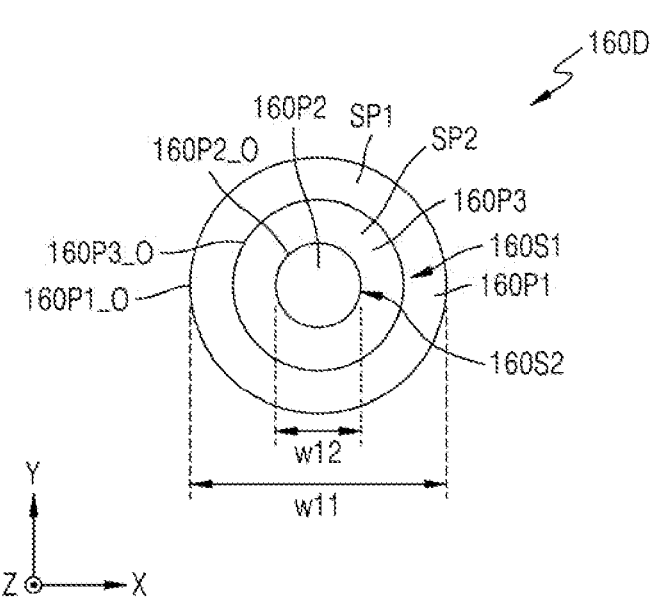
FIG. 16 is a top view illustrating the connecting pillar of FIG. 14.

FIG. 13 is a cross-sectional view illustrating a semiconductor package 1D according to some example embodiments. FIG. 14 is an enlarged view of a portion CX1 of FIG. 13. FIG. 15 is a perspective view schematically illustrating a connecting pillar 160D of FIG. 14. FIG. 16 is a top view illustrating the connecting pillar 160D of FIG. 14.

Referring to FIGS. 13 to 16, the connecting pillar 160D may include the lower area 160P1, an upper area 160P2, and a middle area 160P3. For example, the middle area 160P3 may be disposed on the lower area 160P1 and below the upper area 160P2, and may be integrally formed with the lower area 160P1 and the upper area 160P2. The connecting pillar 160D may further include a first stepped portion 160S1 and a second stepped portion 160S2. The first stepped portion 160S1 may be defined between the lower area 160P1 and the middle area 160P3. The second stepped portion 160S2 may be defined between the middle area 160P3 and the upper area 160P2.

Referring to FIG. 13, the lower area 160P1, the upper area 160P2, and the middle area 160P3 may have a circular or elliptical horizontal cross-section. However, in other example embodiments, the lower area 160P1, the upper area 160P2, and the middle area 160P3 may have horizontal cross-sections of various shapes, such as a triangle, a square, a round square, a rhombus, and a polygon.

Referring to FIG. 16, in the plan view, the outer portion wall 160P1_O of the lower area 160P1 may surround an outer portion wall 160P3_O of the middle area 160P3, and the outer portion wall 160P3_O of the middle area 160P3 may surround the outer portion wall 160P2_O of the upper area 160P2. The lower area 160P1 may include a first shoulder portion SP1 in the outer portion of the lower area 160P1. The middle area 160P3 may include a second shoulder portion SP2 in an outer portion of the middle area 160P3.

The molding layer 150 may cover the entirety of the outer portion wall 160P1_O of the lower area 160P1, the first stepped portion 160S1, the outer portion wall 160P3_O of the middle area 160P3, the second stepped portion 160S2, and the outer portion wall 160P2_O of the upper area 160P2. The molding layer 150 may contact the first and second shoulder portions SP1 and SP2.

According to some example embodiments, the opening 520H (see FIG. 31D) having first and second stepped portions (not shown) may be formed using the phase shift mask PM10 (see FIG. 31C) on the first photoresist material layer 520 (see FIG. 31C) having a negative photosensitivity characteristic, and the opening 520H may be filled with a conductive material such that the connecting pillar 160D may be formed. Accordingly, a defect in a process of forming the opening 520H may be prevented. Thus, the connecting pillar 160D having a relatively small footprint, a relatively large height, and/or a relatively large aspect ratio may be formed.

Moreover, as the connecting pillar 160D may be formed to include the first stepped portion 160S1 and the second stepped portion 160S2, a contact area between the molding layer 150 and the connecting pillar 160D may be relatively large. Therefore, even if a crack occurs between the lower area 160P1 of the connecting pillar 160D and the molding layer 150 (for example, due to a difference in the coefficient of thermal expansion between the connecting pillar 160D and the molding layer 150) in the manufacturing process of the semiconductor package 1D, the crack may not propagate to the upper area 160P2 of the connecting pillar 160D. Accordingly, the semiconductor package 1D may have excellent reliability.

Figure 17:
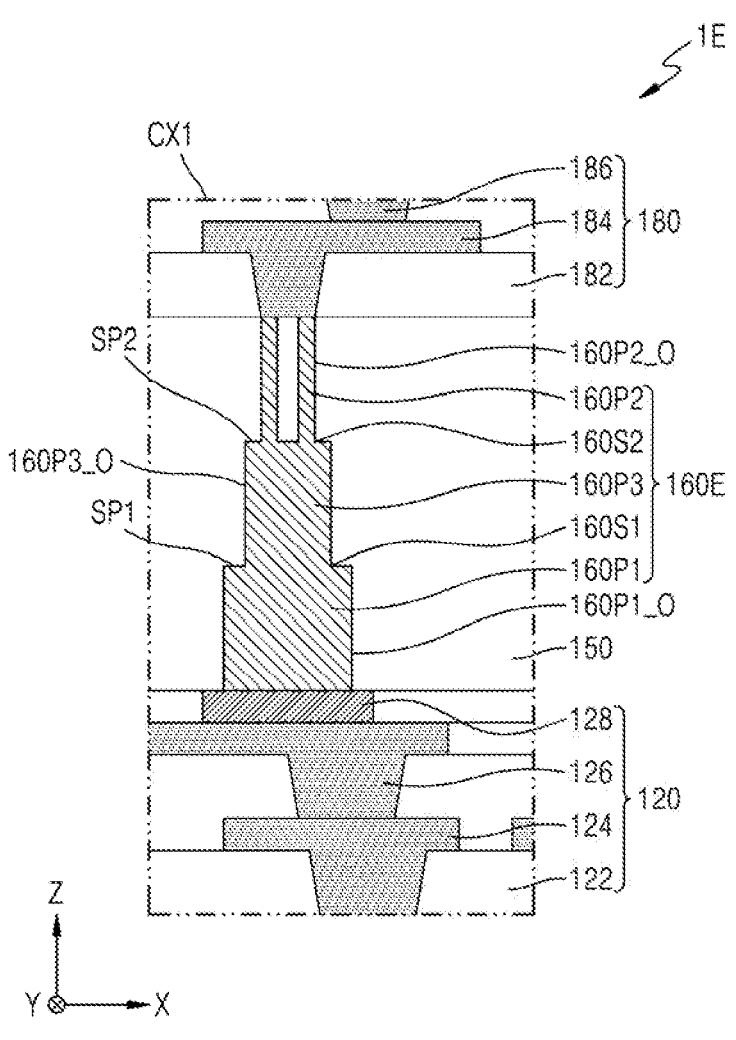
FIG. 17 is a cross-sectional view illustrating a semiconductor package according to some example embodiments.
Figure 18:
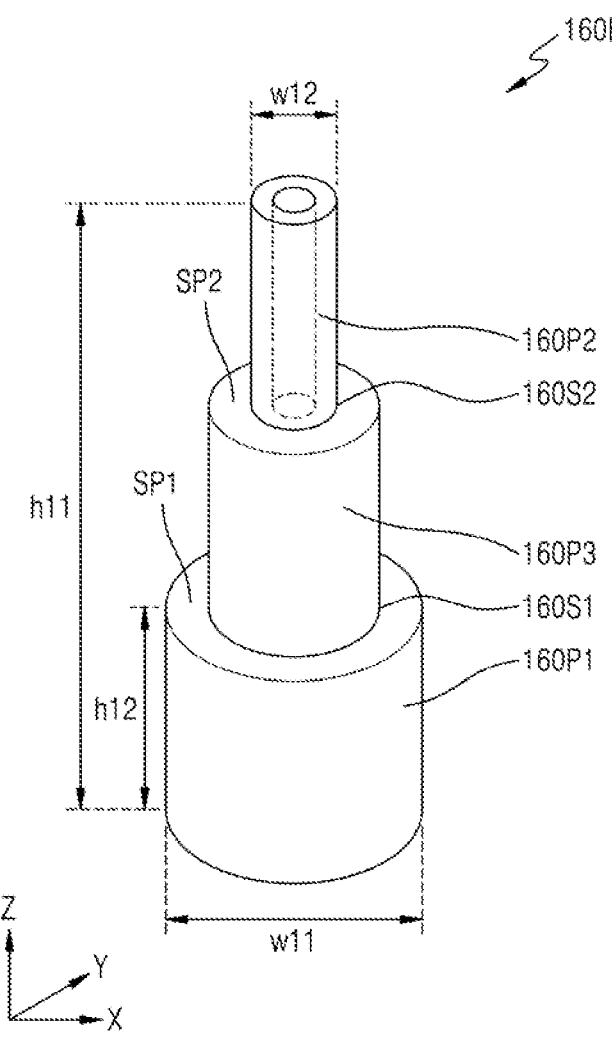
FIG. 18 is a perspective view schematically illustrating a connecting pillar of FIG. 17.

FIG. 17 is a cross-sectional view illustrating a semiconductor package 1E according to some example embodiments. FIG. 18 is a perspective view schematically illustrating a connecting pillar 160E of FIG. 17.

Referring to FIGS. 17 and 18, the lower area 160P1 and the middle area 160P3 of the connecting pillar 160E may have a horizontal cross-section of a circular or oval shape, and the upper area 160P2 may have an annular horizontal cross-section, for example, as described above in connection with FIG. 6.

Figure 19:
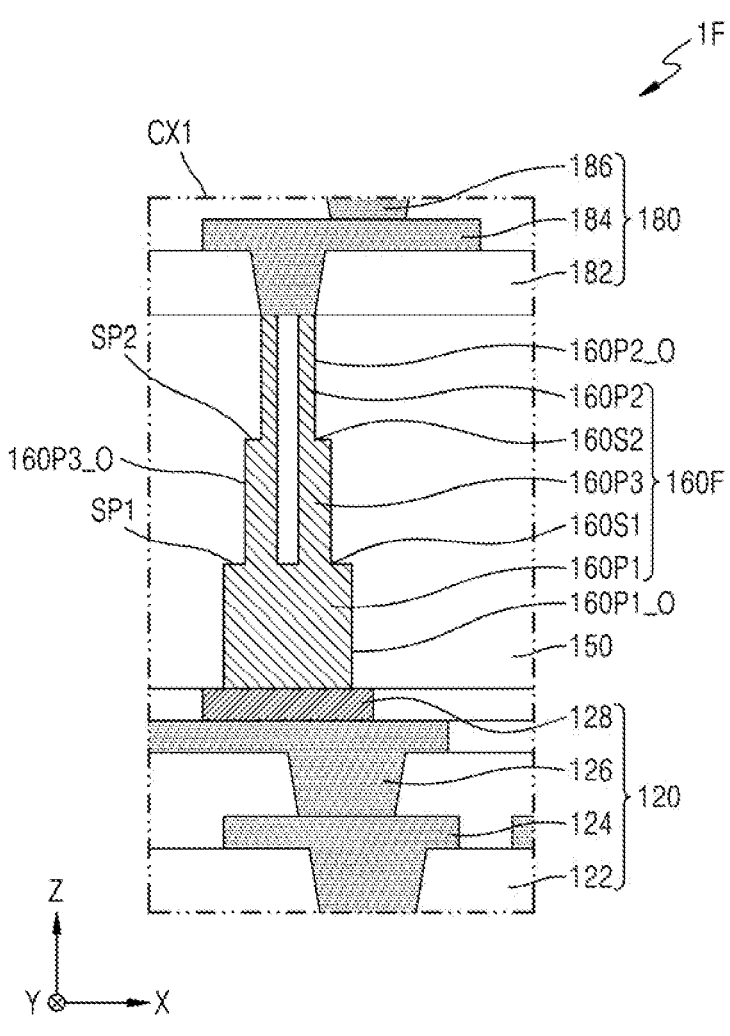
FIG. 19 is a cross-sectional view illustrating a semiconductor package according to some example embodiments.
Figure 20:
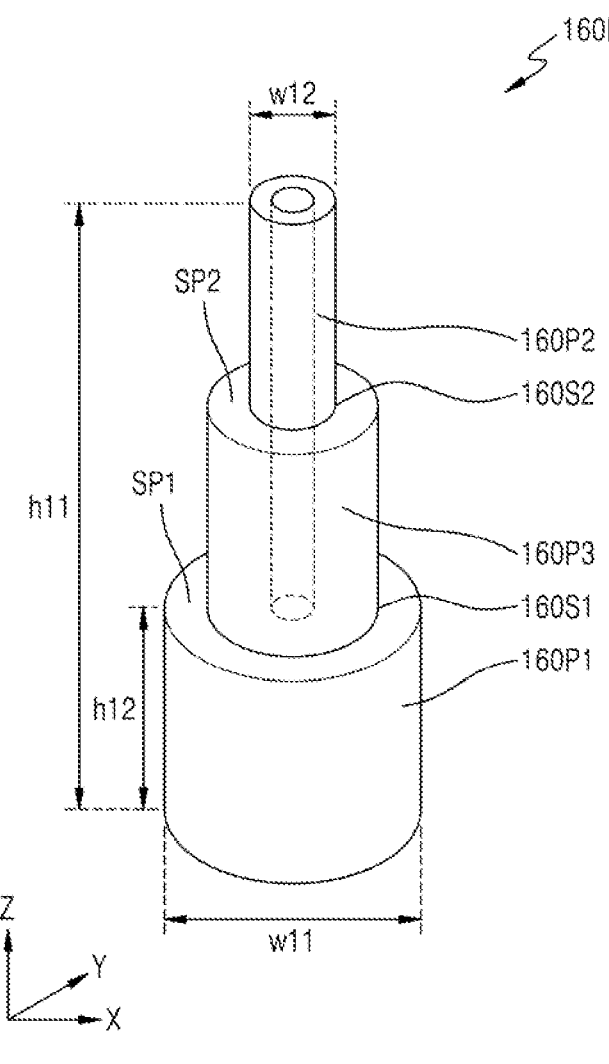
FIG. 20 is a perspective view schematically illustrating a connecting pillar of FIG. 19.

FIG. 19 is a cross-sectional view illustrating a semiconductor package 1F according to some example embodiments. FIG. 20 is a perspective view schematically illustrating a connecting pillar 160F of FIG. 19.

Referring to FIGS. 19 and 20, the lower area 160P1 of the connecting pillar 160F may have a horizontal cross-section of a circular or oval shape, and the middle area 160P3 and the upper area 160P2 may have an annular horizontal cross-section.

Figure 21:
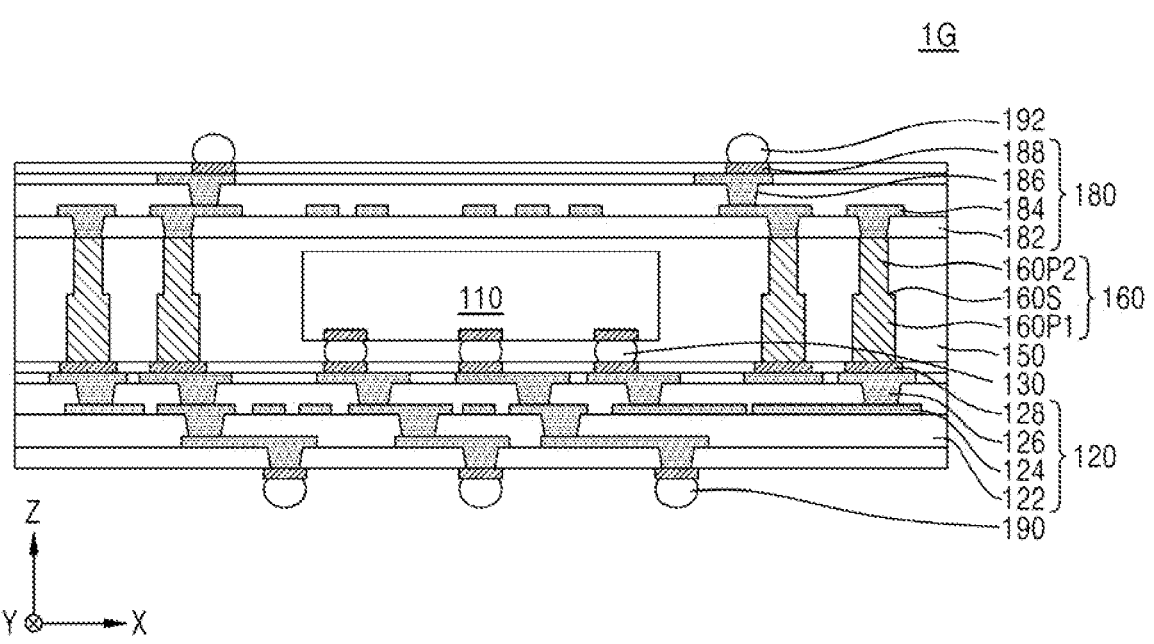
FIG. 21 is a cross-sectional view illustrating a semiconductor package according to some example embodiments.

FIG. 21 is a cross-sectional view illustrating a semiconductor package 1G according to some example embodiments.

Referring to FIG. 21, two connecting pillars 160 may be disposed adjacent to each other on one side of the semiconductor chip 110, and two connecting pillars 160 may be disposed adjacent to each other on the other side of the semiconductor chip 110. According to other example embodiments, three or more connecting pillars 160 may be arranged side-by-side.

Figure 22:
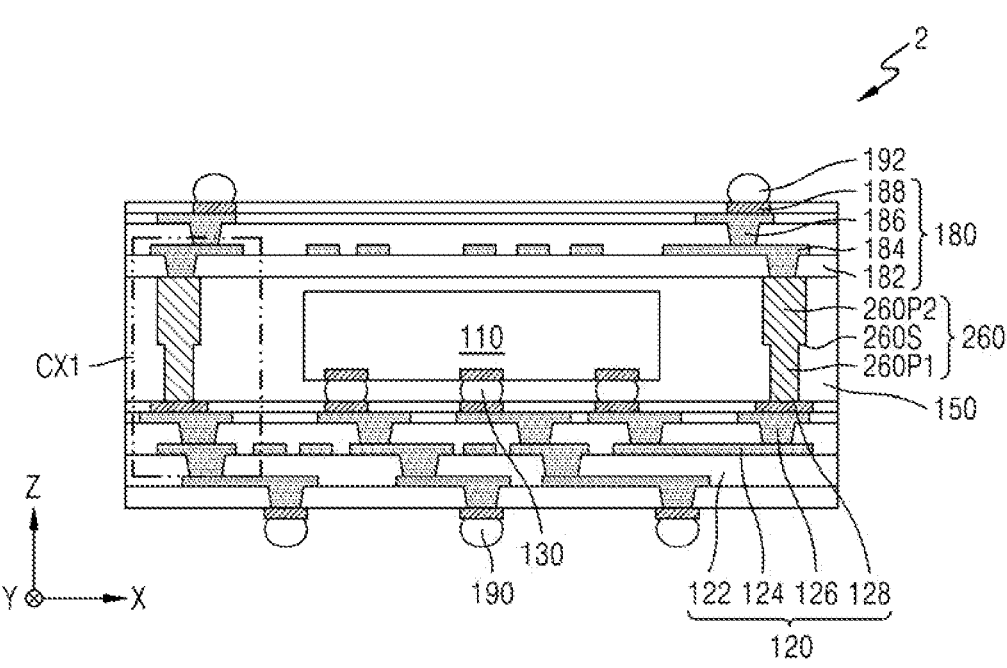
FIG. 22 is a cross-sectional view illustrating a semiconductor package according to some example embodiments.

FIG. 22 is a cross-sectional view illustrating a semiconductor package 2 according to some example embodiments.

Figure 23:
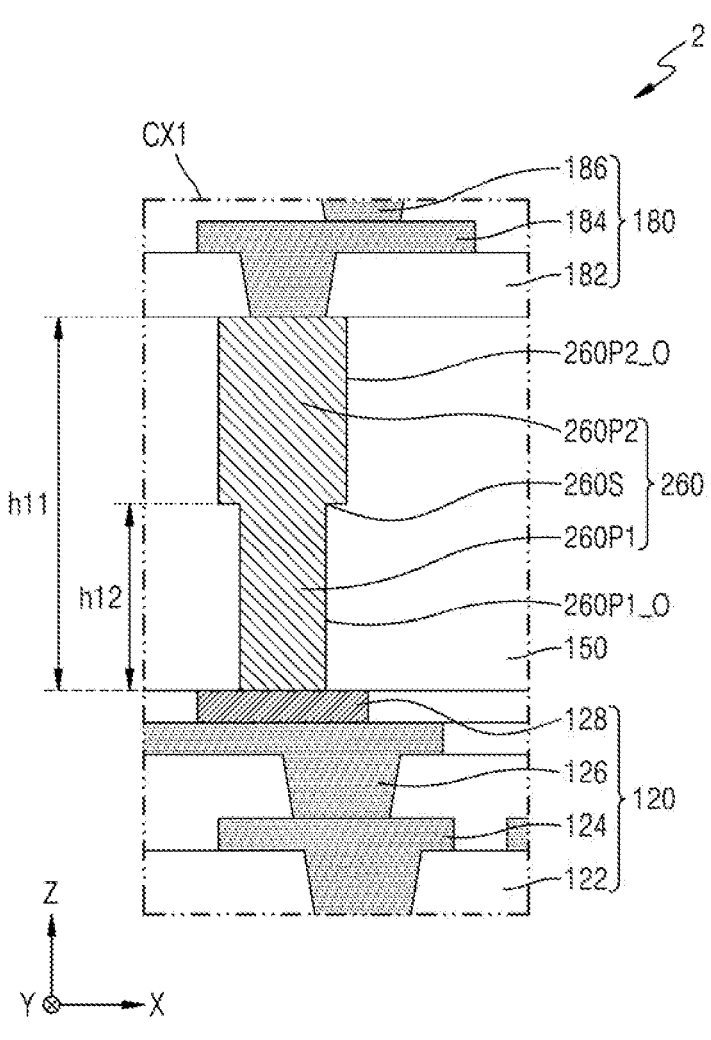
FIG. 23 is an enlarged view of a portion CX1 of FIG. 22.
Figure 24:
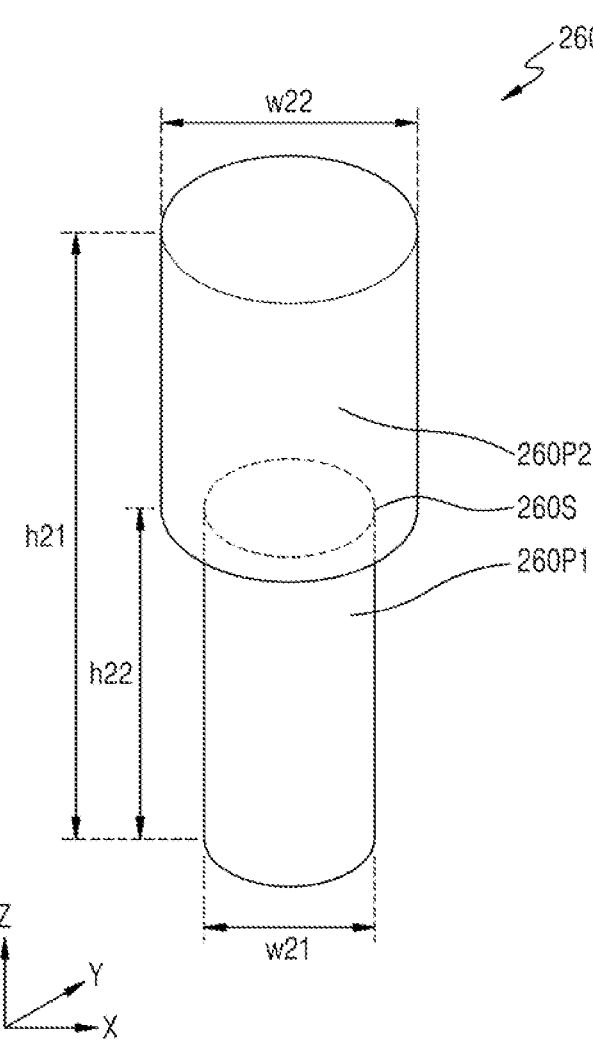
FIG. 24 is a perspective view schematically illustrating a connecting pillar of FIG. 23.
Figure 25:
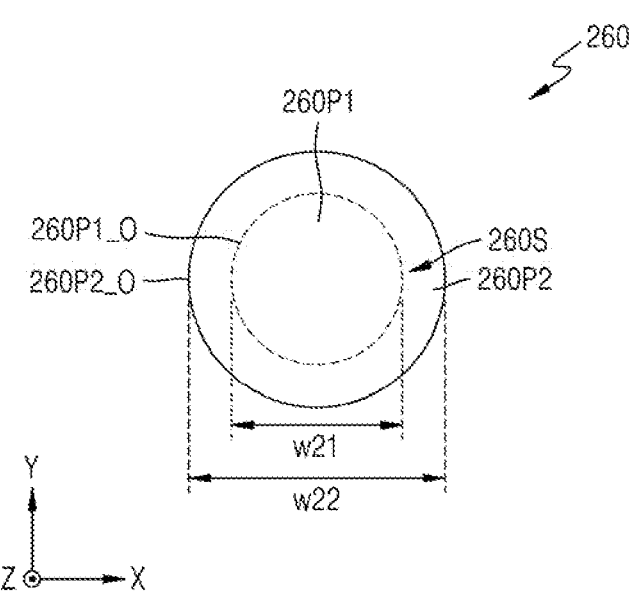
FIG. 25 is a top view illustrating the connecting pillar of FIG. 23.

FIG. 23 is an enlarged view of a portion CX1 of FIG. 22. FIG. 24 is a perspective view schematically illustrating a connecting pillar 260 of FIG. 23. FIG. 25 is a top view illustrating the connecting pillar 260 of FIG. 23. In FIGS. 22 to 25, the same reference numerals as in FIGS. 1 to 21 indicate the same components.

Referring to FIGS. 22 to 25, the connecting pillar 260 may include a lower area 260P1, an upper area 260P2, and a stepped portion 260S defined between the lower area 260P1 and the upper area 260P2. The lower area 260P1 and the upper area 260P2 may have a circular or elliptical horizontal cross-section.

Referring to FIG. 24, the lower area 260P1 may have a first width w21 in a first direction X parallel to the upper surface of the semiconductor chip 110, and the upper area 260P2 may have a second width w22 that is greater than the first width w21 in the first direction X. In some example embodiments, the first width w21 may range from about 40 micrometers to about 200 micrometers, and the second width w22 may range from about 50 micrometers to about 300 micrometers.

The connecting pillar 260 may have a first height h21 in the vertical direction Z. The lower area 260P1 may have a second height h22 in the vertical direction Z. For example, the first height h21 may be in a range of about 100 micrometers to about 400 micrometers, and the second height h22 may be in a range of about 30% to about 70% of the first height h21. In some example embodiments, the aspect ratio of the connecting pillar 260, that is, the ratio of the first height h21 to the second width w22, may be in a range of about 0.5 to about 5.

Referring to FIG. 25, the lower area 260P1 may be entirely arranged to vertically overlap with the upper area 260P2, and in a plan view, an outer portion wall 260P2_O of the upper area 260P2 may surround an outer portion wall 260P1_O of the lower area 260P1. The molding layer 150 may cover the entirety of the outer portion wall 260P1_O of the lower area 260P1 of the connecting pillar 260, a stepped portion 260S, and the outer portion wall 260P2_O of the upper area 260P2 of the connecting pillar 260. As the second width w22 of the upper area 260P2 is greater than the first width w21 of the lower area 260P1, an outer periphery of a bottom surface of the upper area 260P2 is covered by the molding layer 150 and may be in contact with the molding layer 150.

In general, to form a fan-out wafer level package, after the first redistribution layer 120 is formed on a carrier substrate (not shown), and the connecting pillar 160 is first formed on the first redistribution layer 120, the semiconductor chip 110 may be attached on the first redistribution layer 120, and the molding layer 150 and the second redistribution layer 180 may be formed. To form the connecting pillar 260, a method of forming an opening by performing an exposure process on a photoresist layer and forming the connecting pillar 260 inside the opening may be used. However, as the target aspect ratio of the opening increases, there may be an issue in that a defect may occur in the opening forming process, such as not completely removing the photoresist layer from the bottom of the opening.

However, according to some example embodiments, an opening 620H (see FIG. 32C) having a stepped portion 620S (see FIG. 32C) may be formed using a phase shift mask PM20 (see FIG. 32B) on a second photoresist material layer 620 (see FIG. 32B) having a positive photosensitive characteristic, and the opening 620H may be filled with a conductive material such that the connecting pillar 260 may be formed. Accordingly, a defect in a process of forming the opening 620H may be prevented. Thus, the connecting pillar 260 having a relatively small footprint, a relatively large height, and/or a relatively large aspect ratio may be formed.

In addition, as the connecting pillar 260 may include a stepped portion 260S between the lower area 260P1 and the upper area 260P2 and the molding layer 150 surrounds the sidewall of the connecting pillar 260, a contact area between the molding layer 150 and the connecting pillar 260 may be relatively large. Therefore, even if a crack occurs between the lower area 260P1 of the connecting pillar 260 and the molding layer 150 (for example, due to a difference in the coefficient of thermal expansion between the connecting pillar 260 and the molding layer 150) in the manufacturing process of the semiconductor package 2, the crack may not propagate to the upper area 260P2 of the connecting pillar 260. Accordingly, the semiconductor package 2 may have excellent reliability.

Figure 26:
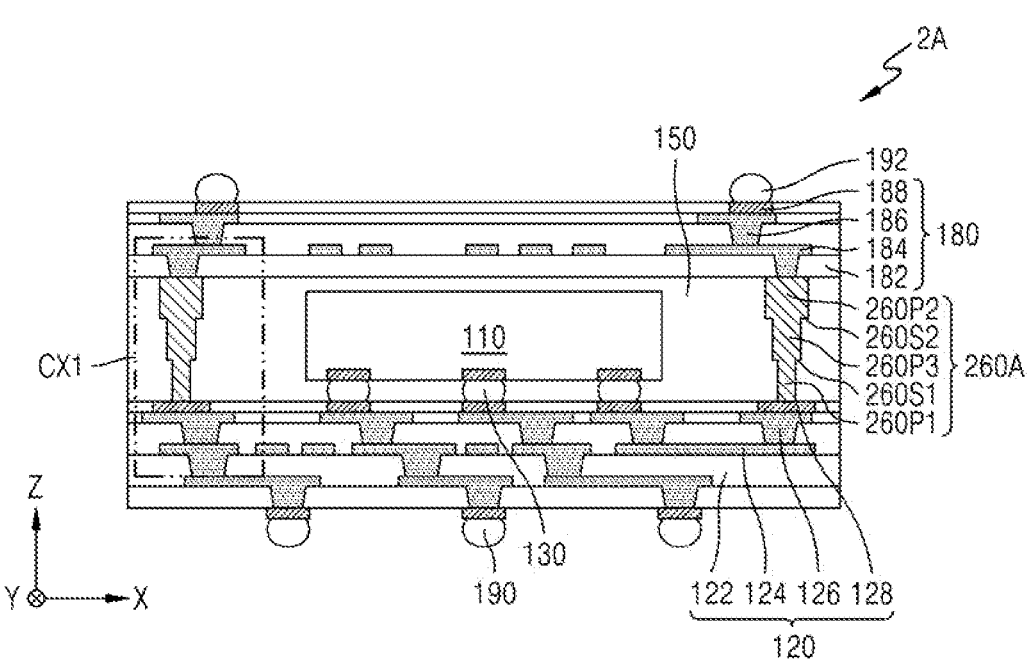
FIG. 26 is a cross-sectional view illustrating a semiconductor package according to some example embodiments.
Figure 27:
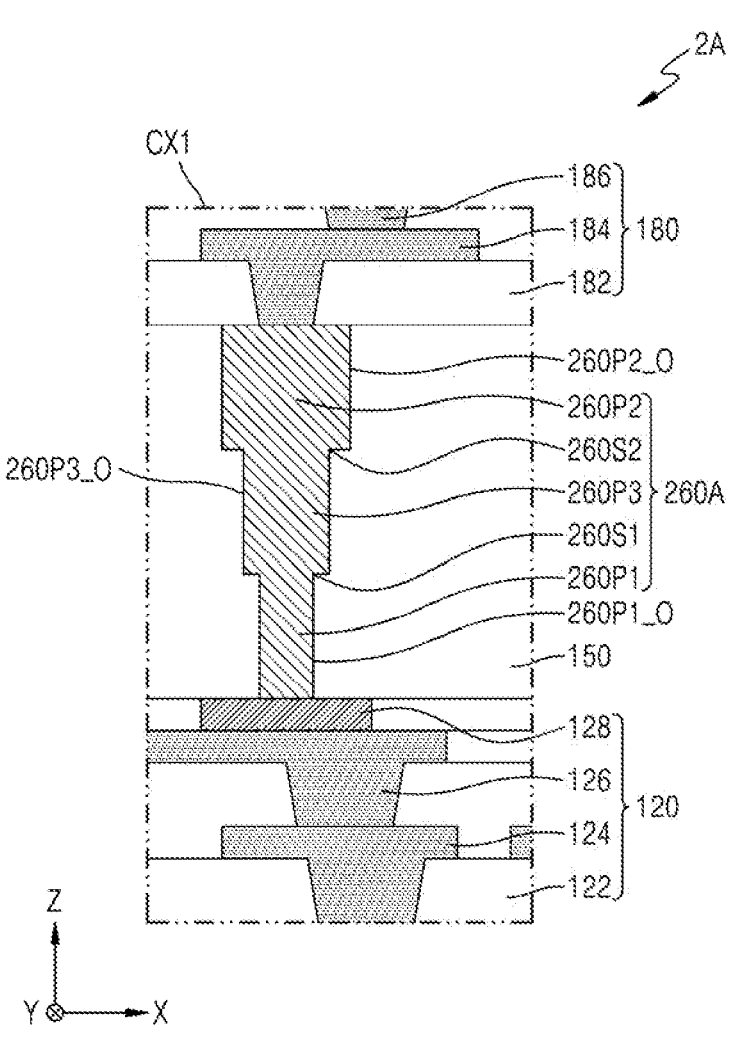
FIG. 27 is an enlarged view of a portion CX1 of FIG. 26.

FIG. 26 is a cross-sectional view illustrating a semiconductor package 2A according to some example embodiments. FIG. 27 is an enlarged view of a portion CX1 of FIG. 26. In FIGS. 26 and 27, the same reference numerals as in FIGS. 1 to 25 indicate the same components.

Referring to FIGS. 26 and 27, a connecting pillar 260A may include the lower area 260P1, the upper area 260P2, and a middle area 260P3. For example, the middle area 260P3 may be disposed on the lower area 260P1 and below the upper area 260P2, and may be integrally formed with the lower area 260P1 and the upper area 260P2. The connecting pillar 260A may further include a first stepped portion 260S1 and a second stepped portion 260S2. The first stepped portion 260S1 may be defined between the lower area 260P1 and the middle area 260P3. The second stepped portion 260S2 may be defined between the middle area 260P3 and the upper area 260P2.

In some example embodiments, the lower area 260P1, the upper area 260P2, and the middle area 260P3 may have a circular or elliptical horizontal cross-section. However, in other example embodiments, the lower area 260P1, the upper area 260P2, and the middle area 260P3 may have horizontal cross-sections of various shapes, such as a triangle, a square, a round square, a rhombus, and a polygon.

According to some example embodiments, the opening 620H (see FIG. 32C) having first and second stepped portions (not shown) may be formed using the phase shift mask PM20 (see FIG. 32B) on the second photoresist material layer (see FIG. 32B) having a positive photosensitive characteristic, and the opening 620H may be filled with a conductive material such that the connecting pillar 260A may be formed. Accordingly, a defect in a process of forming the opening 620H may be prevented. Thus, the connecting pillar 260A having a relatively small footprint, a relatively large height, and/or a relatively large aspect ratio may be formed.

Moreover, as the connecting pillar 260A may be formed to include the first stepped portion 260S1 and the second stepped portion 260S2, the contact area between the molding layer 150 and the connecting pillar 260A may be relatively large. Therefore, even if a crack occurs between the lower area 260P1 of the connecting pillar 260A and the molding layer 150 (for example, due to a difference in the coefficient of thermal expansion between the connecting pillar 260A and the molding layer 150) in the manufacturing process of the semiconductor package 2A, the crack may not propagate to the upper area 260P2 of the connecting pillar 260A. Accordingly, the semiconductor package 2A may have excellent reliability.

Figure 28:
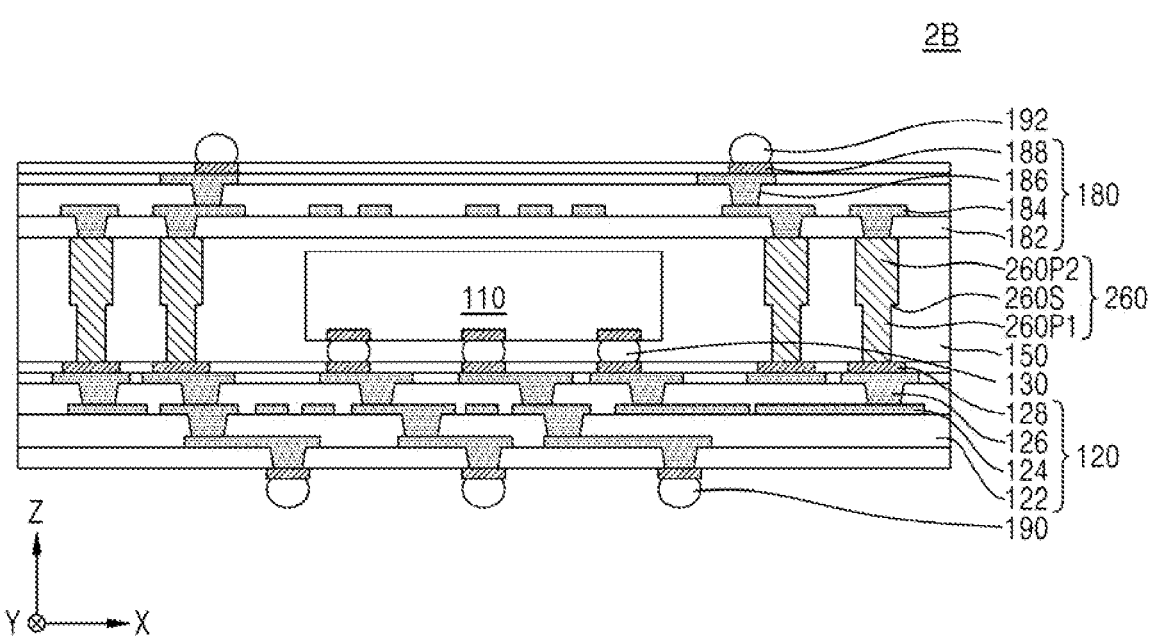
FIG. 28 is a cross-sectional view illustrating a semiconductor package according to some example embodiments.

FIG. 28 is a cross-sectional view illustrating a semiconductor package 2B according to some example embodiments.

Referring to FIG. 28, two connecting pillars 260 may be disposed adjacent to each other on one side of the semiconductor chip 110, and two connecting pillars 260 may be disposed adjacent to each other on the other side of the semiconductor chip 110. According to other example embodiments, three or more connecting pillars 260 may be arranged side-by-side.

Figure 29:
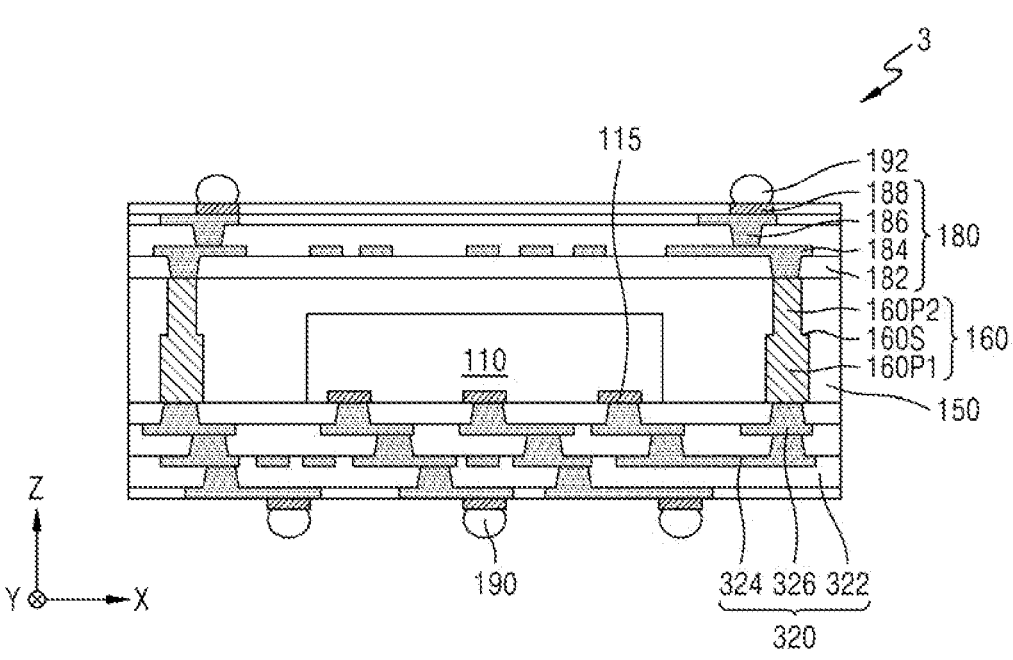
FIG. 29 is a cross-sectional view illustrating a semiconductor package according to some example embodiments.

FIG. 29 is a cross-sectional view illustrating a semiconductor package 3 according to some example embodiments. In FIG. 29, the same reference numerals as in FIGS. 1 to 28 denote the same components.

Referring to FIG. 29, the semiconductor package 3 may include a semiconductor chip 110, a first redistribution layer 320, a molding layer 150, a connecting pillar 160, a second redistribution layer 180, and an external connection terminal 190.

The first redistribution layer 320 may include a first insulating layer 322, a first redistribution pattern 324, and a first via 326. The first via 326 may include an upper surface disposed close to the connecting pillar 160 or the semiconductor chip 110, and a lower surface disposed far away from the connecting pillar 160 or the semiconductor chip 110. A width of the lower surface of the first via 326 may be formed to be greater than the width of the upper surface of the first via 326.

The semiconductor chip 110 may have an active surface facing the first redistribution layer 320. A pad 115 may be provided on the active surface of the semiconductor chip 110. The pad 115 may be disposed on the first redistribution layer 320, and may be electrically connected to the first via 326 without a separate connection bump.

In FIG. 29, the semiconductor package 3 is exemplarily shown as including the connecting pillar 160 having the same shape as that described with reference to FIGS. 1 to 4, but the semiconductor package 3 may include the connecting pillars 160A, 160B, 160C, 160D, 160E, 160F, 260 and 260A described with reference to FIGS. 5 to 28.

Figure 30:
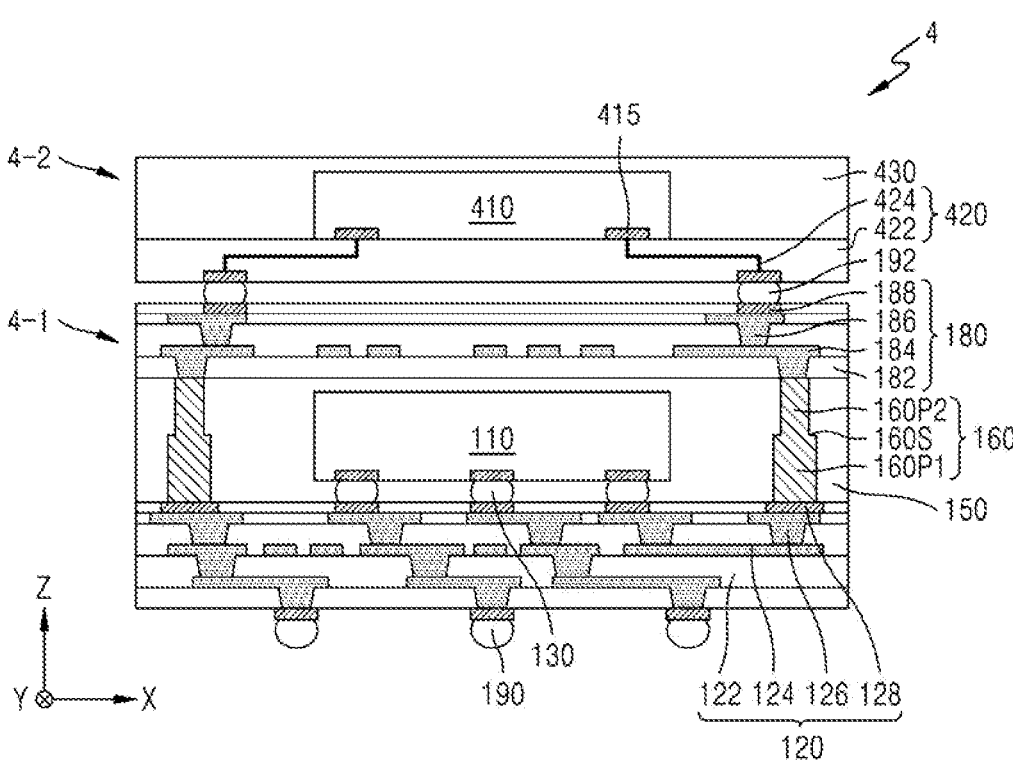
FIG. 30 is a cross-sectional view illustrating a semiconductor package according to some example embodiments.

FIG. 30 is a cross-sectional view illustrating a semiconductor package 4 according to some example embodiments. In FIG. 30, the same reference numerals as in FIGS. 1 to 39 denote the same components.

Referring to FIG. 30, the semiconductor package 4 may include a semiconductor sub-package 4-1 and a semiconductor sub-package 4-2 connected to the semiconductor sub-package 4-1 through a connection member 192. By way of example, the semiconductor sub-package 4-1 is illustrated as including the semiconductor package 1 described with reference to FIGS. 1 to 4, but the semiconductor packages 1A, 1B, 1C, 1D, 1E, 1F, 1G, 2, 2A, 2B, and 3 described with reference to FIGS. 5 to 29 may be included.

In FIG. 30, the semiconductor sub-package 4-1 is illustrated as including one semiconductor chip 110, but the semiconductor sub-package 4-1 may include two or more semiconductor chips 110 mounted on the first redistribution layer 120, and the molding layer 150 may be disposed to cover the two or more semiconductor chips 110.

The semiconductor sub-package 4-2 may include a semiconductor chip 410, a redistribution layer 420, and a molding layer 430. The semiconductor chip 410 may be a memory chip or a logic chip. For example, the semiconductor chip 410 may be the same type as the semiconductor chip 110 or a different type of chip. In some example embodiments, the semiconductor sub-package 4-2 may include a plurality of the semiconductor chips 410. The redistribution layer 420 may include an insulating layer 422 and a redistribution pattern 424, and may be attached to the active surface of the semiconductor chip 410. The molding layer 430 may cover the side and upper surfaces of the semiconductor chip 410 on the redistribution layer 420.

FIGS. 31A to 31I are schematic diagrams illustrating a method of manufacturing the semiconductor package 1, according to some example embodiments.

Figure 31A:
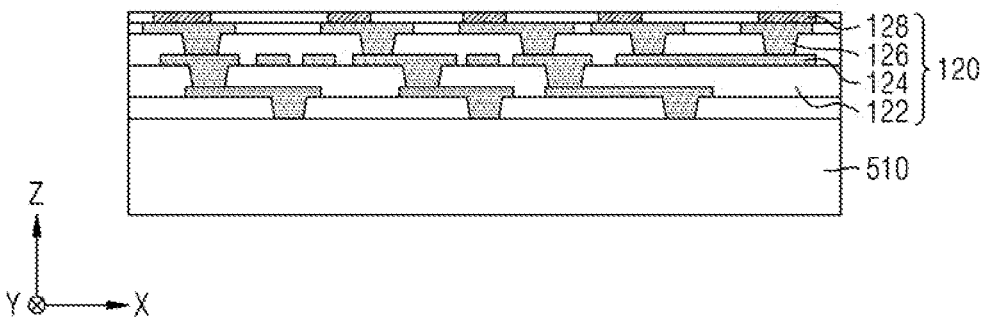
FIGS. 31A to 31I are schematic diagrams illustrating a method of manufacturing a semiconductor package, according to some example embodiments.

Referring to FIG. 31A, a first redistribution layer 120 may be formed on a first support carrier 510. For example, a first insulating layer 122 may be formed on the first support carrier 510, and the first redistribution layer 120 may be formed by repeating the process of forming the first redistribution pattern 124 and the first via 126 on the first insulating layer 122 using a conductive material. A first pad 128 may be disposed on the uppermost portion of the first redistribution layer 120.

Figure 31B:
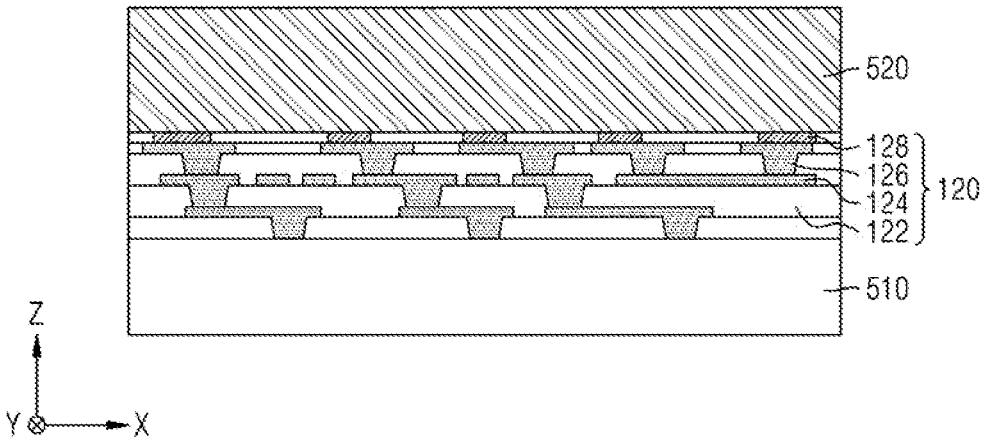

Referring to FIG. 31B, a first photoresist material layer 520 may be formed on the first redistribution layer 120. The first photoresist material layer 520 may include a photoresist material having a negative photosensitive property. The first photoresist material layer 520 may be disposed to cover the entire upper surface of the first redistribution layer 120. The first photoresist material layer 520 may be formed to have a height of about 100 micrometers to about 400 micrometers in the vertical direction Z.

Figure 31C:
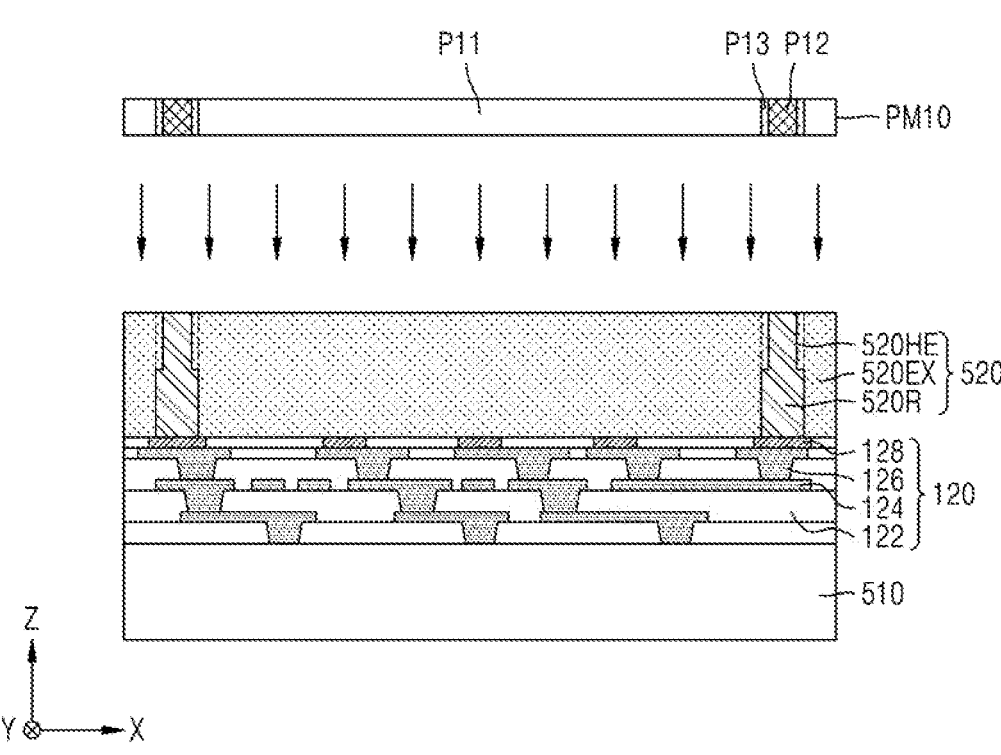

Referring to FIG. 31C, a photolithography process may be performed on the first photoresist material layer 520 by using the phase shift mask PM10.

The phase shift mask PM10 may include a first area P11, a second area P12, and a third area P13. The first area P11 may be an area through which light of a particular wavelength used in photolithography passes. The second area P12 may be an area through which light of the particular wavelength does not transmit. The third area P13 may be an area that partially absorbs the light of the particular wavelength and transmits a part of the light of the particular wavelength. For example, light passing through the first area P11 of the phase shift mask PM10 and reaching the first photoresist material layer 520 may have a first intensity, light passing through the third area P13 of the phase shift mask PM10 and reaching the first photoresist material layer 520 may have a second intensity that is lower than the first intensity, and light may not pass through the second area P12 of the phase shift mask PM10 to reach the first photoresist material layer 520, i.e., may have a substantially zero third intensity at the first photoresist material layer 520.

In some example embodiments, the second area P12 may include a light blocking material, such as chromium, nickel, tantalum, or tantalum nitride, and the third area P13 may include zirconium, molybdenum, molybdenum nitride, niobium, a polymer, and the like.

After the photolithography process, an exposed area 520EX, a partially exposed area 520HE, and a residual area 520R may be formed in the first photoresist material layer 520. For example, as light having the relatively large first intensity is irradiated to the first photoresist material layer 520 through the first area P11 of the phase shift mask P10, the exposed area 520EX may be formed through the entire thickness of the first photoresist material layer 520. The exposed area 520EX may be an area in which a negative photoresist material included in the first photoresist material layer 520 is cured. The residual area 520R may be an area that vertically overlaps with the second area P12 of the phase shift mask PM10, and may be an area to which substantial exposure by light is not applied, and may be an area in which the negative photoresist material included in the first photoresist material layer 520 is not changed. The partially exposed area 520HE may be an area cured to a preset depth from the upper surface of the first photoresist material layer 520 as light having a relatively small second intensity is irradiated to the first photoresist material layer 520 through the third area P13 of the phase shift mask PM10.

Figure 31D:
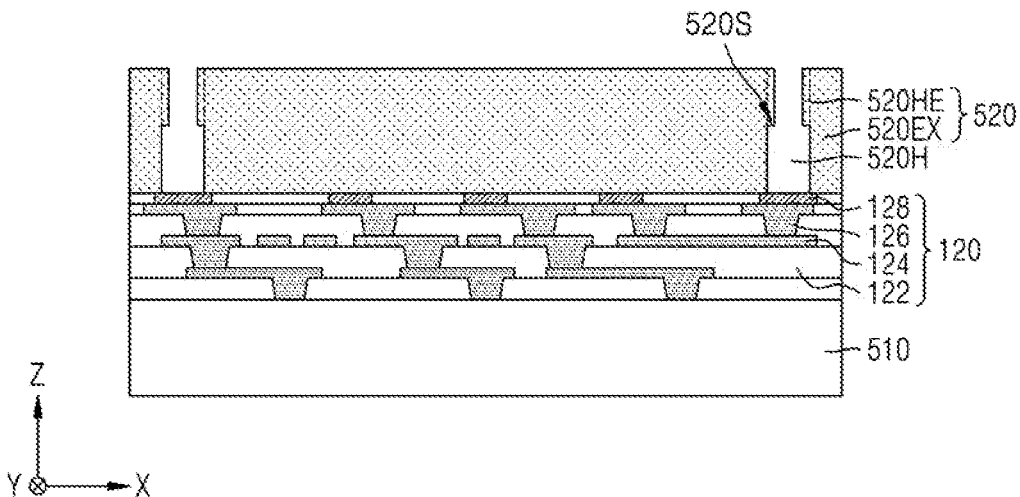

Referring to FIG. 31D, the opening 520H may be formed by performing a developing process on the first photoresist material layer 520. For example, the residual area 520R (refer to FIG. 31C) may be removed and the opening 520H may be formed by the developing process. In particular, the partially exposed area 520HE is cured by a preset depth from the upper surface of the first photoresist material layer 520 and may not be removed during the developing process, and a stepped portion 520S may be formed at the boundary between the partially exposed area 520HE and the residual area 520R.

Figure 31E:
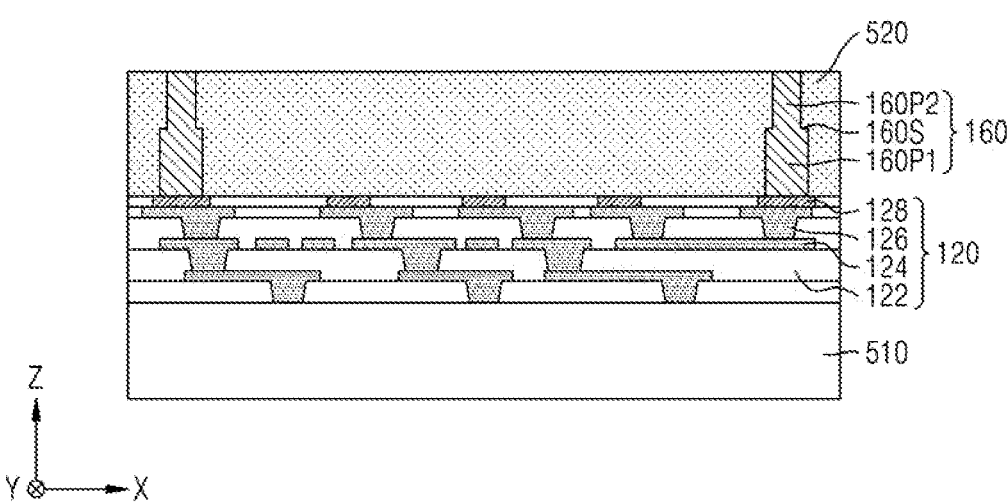

Referring to FIG. 31E, a connecting pillar 160 filling the inside of the opening 520H may be formed on the first photoresist material layer 520. For example, the connecting pillar 160 may be formed using at least one of copper (Cu), aluminum (Al), silver (Ag), titanium (Ti), and nickel (Ni). In some example embodiments, a seed layer (not shown) may be formed on the inner wall of the opening 520H using copper, and the connecting pillar 160 may be formed by filling a conductive material using copper on the seed layer by an electrolytic plating process or an electroless plating process.

In some example embodiments, the opening 520H includes the stepped portion 520S, and the stepped portion 160S of the connecting pillar 160 may be formed at a position corresponding to the stepped portion 520S. Also, the lower area 160P1 of the connecting pillar 160 may be formed to have a greater width than the upper area 160P2.

Figure 31F:
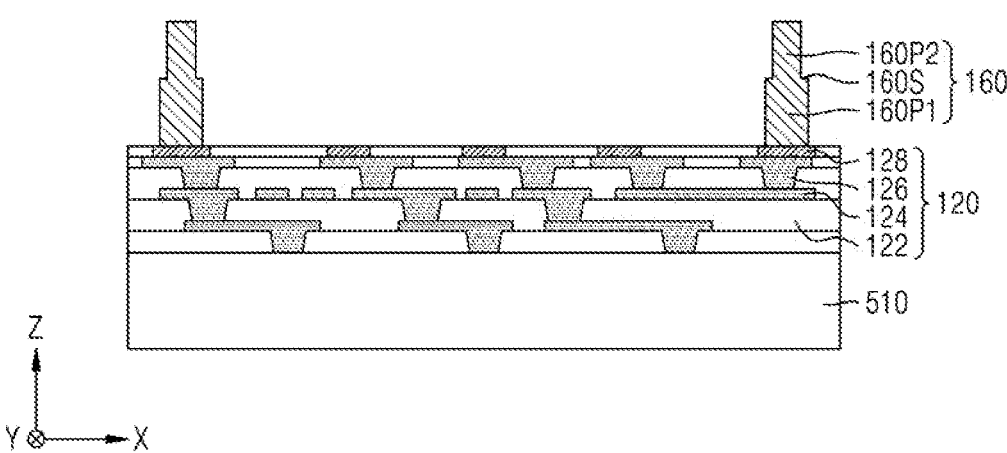

Referring to FIG. 31F, the first photoresist material layer 520 may be removed.

Figure 31G:
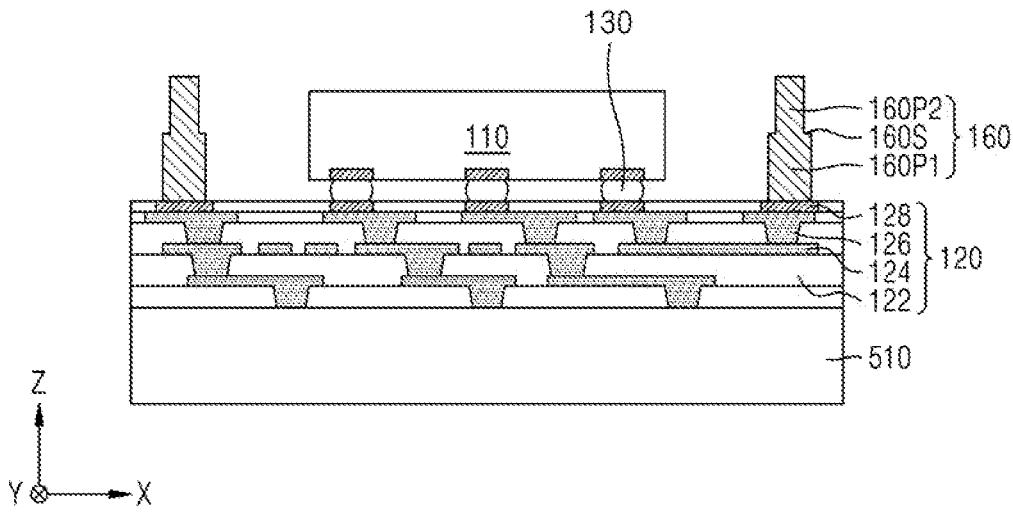

Referring to FIG. 31G, the semiconductor chip 110 may be attached on the first redistribution layer 120. The first semiconductor chip 110 may be electrically connected to the first pad 128 of the first redistribution layer 120 by a connection bump 130.

Figure 31H:
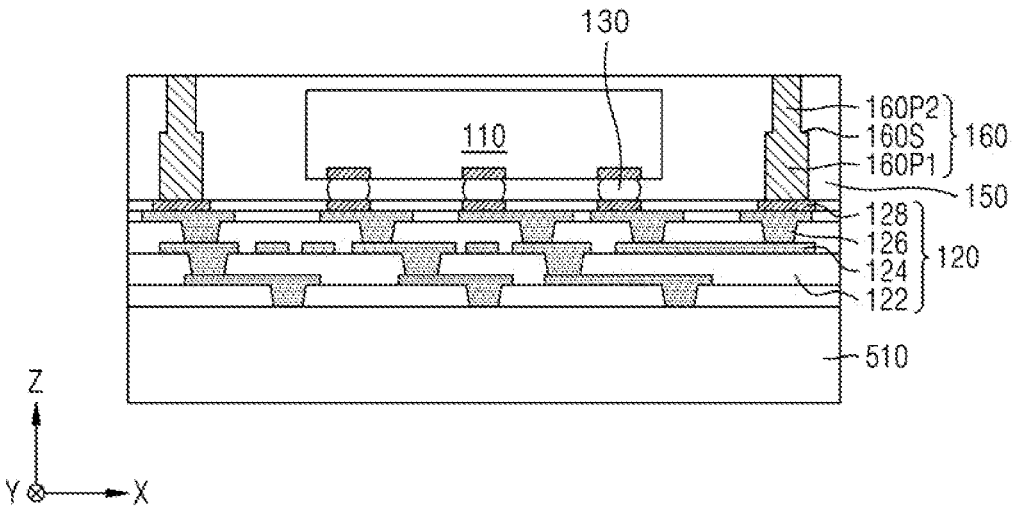

Referring to FIG. 31H, the molding layer 150 covering the semiconductor chip 110 and the connecting pillar 160 may be formed on the first redistribution layer 120. In some example embodiments, the molding layer 150 may be formed by performing transfer molding or compression molding.

Figure 31I:
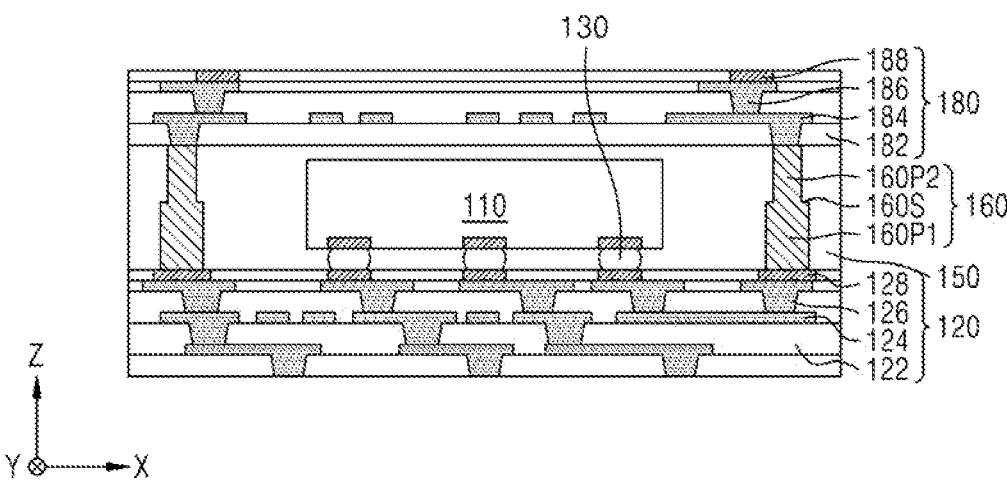

Referring to FIG. 31I, a second redistribution layer 180 may be formed on the molding layer 150. For example, the second insulating layer 182 may be formed on the molding layer 150, and the second redistribution layer 180 may be formed by repeating the process of forming the second redistribution pattern 184 and the second via 186 on the second insulating layer 182 using a conductive material. A second pad 188 may be disposed on the uppermost portion of the second redistribution layer 180.

Thereafter, the first support carrier 510 may be separated from the first redistribution layer 120.

After that, referring back to FIG. 1, the external connection terminal 190 may be attached to the lower surface of the first redistribution layer 120, and the connecting member 192 may be attached to the upper surface of the second redistribution layer 180.

By performing the above-described process, the semiconductor package 1 may be completed.

In general, to form fan-out wafer level packages, after the first redistribution layer 120 is formed on a carrier substrate (not shown), and the connecting pillar 160 may be first formed on the first redistribution layer 120, the semiconductor chip 110 may be attached on the first redistribution layer 120, and the molding layer 150 and the second redistribution layer 180 may be formed. To form the connecting pillar 160, a method of forming an opening by performing an exposure process on a photoresist material layer and forming the connecting pillar 160 inside the opening may be used. However, as the target aspect ratio of the opening increases, there may be an issue in that a defect may occur in the process of forming the opening, such as not completely removing the photoresist layer from the bottom of the opening.

However, according to some example embodiments, the opening 520H having the stepped portion 520S may be formed using the phase shift mask PM10 in the first photoresist material layer 520 having negative photosensitivity properties, and the opening 520H may be filled with a conductive material such that the connecting pillar 160 may be formed. Accordingly, a defect in the process of forming the opening may be prevented, and thus, for example, the connecting pillar 160 having a relatively small footprint, a relatively large height, and/or a relatively large aspect ratio may be formed.

In addition, as the connecting pillar 160 may includes the stepped portion 160S between the lower area 160P1 and the upper area 160P2, and the molding layer 150 may surround the sidewall of the connecting pillar 160. Thus, a contact area between the molding layer 150 and the connecting pillar 160 may be relatively large. Therefore, even if a crack occurs between the lower area 160P1 of the connecting pillar 160 and the molding layer 150 (for example, due to a difference in the coefficient of thermal expansion between the connecting pillar 160 and the molding layer 150) in the manufacturing process of the semiconductor package 1, the crack may not propagate to the upper area 160P2 of the connecting pillar 160. Accordingly, the semiconductor package 1 may have excellent reliability.

FIGS. 32A to 32D are schematic diagrams illustrating a method of manufacturing the semiconductor package 2 according to some example embodiments.

First, the process described with reference to FIG. 31A may be performed to form the first redistribution layer 120 on the first support carrier 510.

Figure 32A:
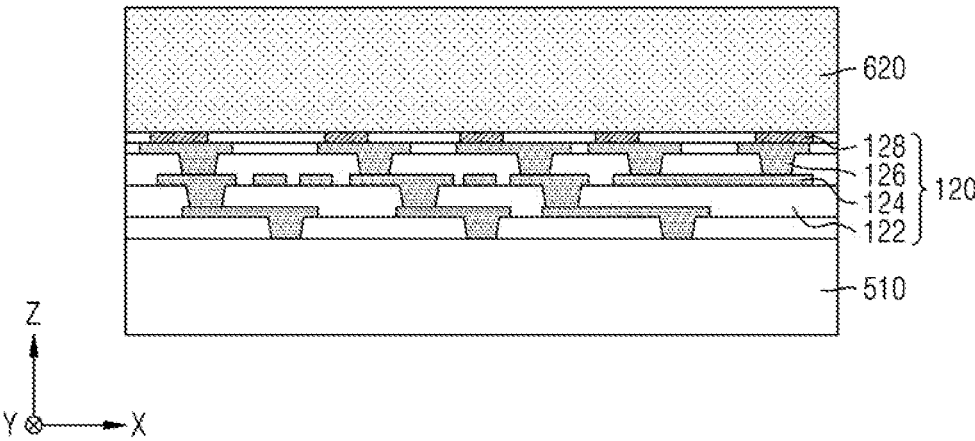
FIGS. 32A to 32D are schematic diagrams illustrating a method of manufacturing a semiconductor package, according to some example embodiments.

Referring to FIG. 32A, the second photoresist material layer 620 may be formed on the first redistribution layer 120. For example, the second photoresist material layer 620 may include a photoresist material having a positive photosensitive characteristic. For example, the second photoresist material layer 620 may be disposed to cover the entire upper surface of the first redistribution layer 120.

Figure 32B:
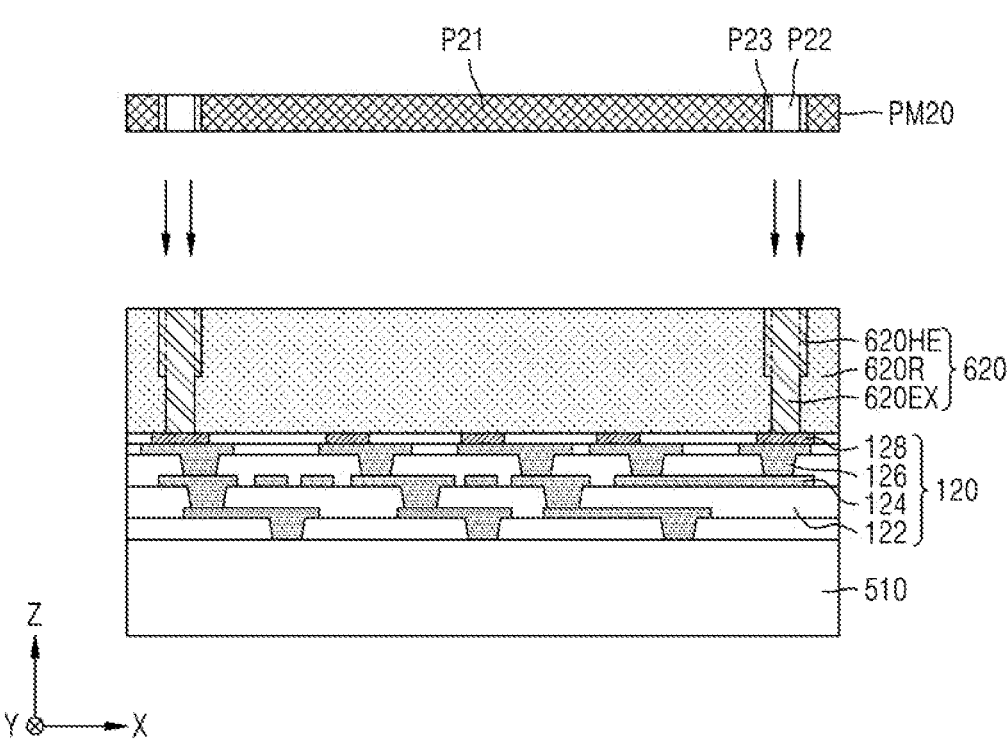

Referring to FIG. 32B, a photolithography process may be performed on the second photoresist material layer 620 by using the phase shift mask PM20.

The phase shift mask PM20 may include a first area P21, a second area P22, and a third area P23. The first area P21 may be an area through which light of a particular wavelength used in photolithography does not transmit. The second area P22 may be an area through which light of the particular wavelength is transmitted. The third area P23 may be an area that partially absorbs the light of the particular wavelength and transmits a part of the light of the particular wavelength. For example, light passing through the second area P22 of the phase shift mask PM20 and reaching the second photoresist material layer 620 may have a first intensity. Light passing through the third area P23 of the phase shift mask PM20 and reaching the second photoresist material layer 620 may have a second intensity that is lower than the first intensity. Light may not pass through the first area P21 of the phase shift mask PM20 to reach the second photoresist material layer 620, i.e., may have a substantially zero third intensity.

In some example embodiments, the first area P21 may include a light blocking material, such as chromium, nickel, tantalum, or tantalum nitride, and the third area P23 may include zirconium, molybdenum, molybdenum nitride, niobium, a polymer, and the like.

After the photolithography process, an exposed area 620EX, a partially exposed area 620HE, and a residual area 620R may be formed in the second photoresist material layer 620. For example, as light having the relatively large first intensity is irradiated to the second photoresist material layer 620 through the second area P22 of the phase shift mask PM20, the exposed area 620EX may be formed through the entire thickness of the second photoresist material layer 620. The exposed area 620EX may be an area in which chemical properties of the positive photoresist material included in the second photoresist material layer 620 are changed. The residual area 620R may be an area that vertically overlaps with the first area P21 of the phase shift mask PM10, may be an area to which substantial exposure by light is not applied, and may be an area in which the positive photoresist material included in the second photoresist material layer 620 is not changed. As light having a relatively small second intensity is irradiated to the second photoresist material layer 620 through the third area P23 of the phase shift mask PM20, the partially exposed area 620HE may be an area in which chemical properties are changed by a preset depth from the upper surface of the second photoresist material layer 620.

Figure 32C:
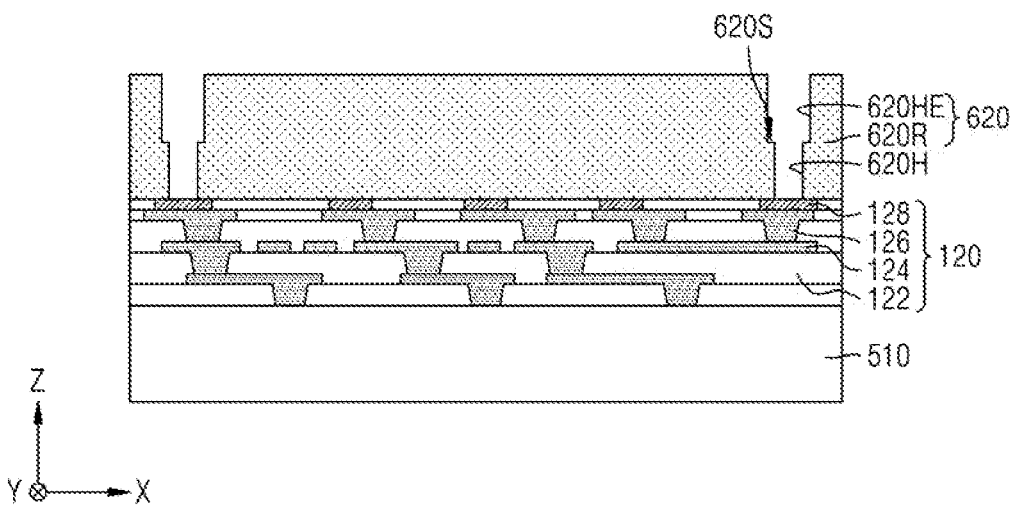

Referring to FIG. 32C, the opening 620H may be formed by performing a development process on the second photoresist material layer 620. For example, the exposed area 620EX (refer to FIG. 32B) may be removed and the opening 620H may be formed by the developing process. In particular, the partially exposed area 620HE may be changed in chemical properties by a preset depth from the upper surface of the second photoresist material layer 620 and may be removed during the developing process. The stepped portion 620S may be formed at the boundary between the partially exposed area 620HE and the residual area 620R.

Figure 32D:
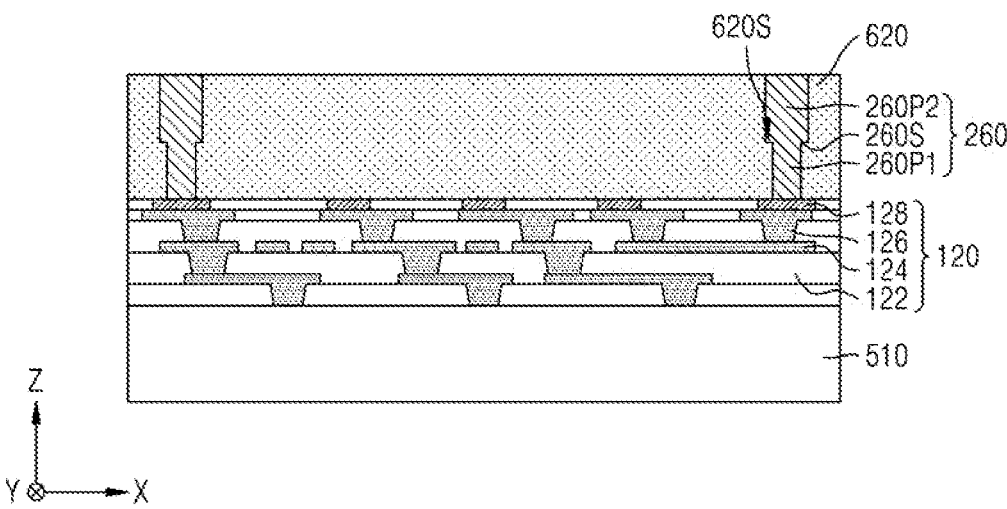

Referring to FIG. 32D, the connecting pillar 260 filling the inside of the opening 620H may be formed on the second photoresist material layer 620. For example, the connecting pillar 260 may be formed using at least one of copper (Cu), aluminum (Al), silver (Ag), titanium (Ti), and nickel (Ni). In some example embodiments, a seed layer (not shown) is formed on the inner wall of the opening 620H using copper, and the connecting pillar 260 may be formed by filling a conductive material using copper on the seed layer by an electrolytic plating process or an electroless plating process.

In some example embodiments, the opening 620H may include the stepped portion 620S, and the stepped portion 260S of the connecting pillar 260 may be formed at a position corresponding to the stepped portion 620S. Also, the lower area 260P1 of the connecting pillar 260 may be formed to have a smaller width than the upper area 260P2.

Thereafter, the process described with reference to FIGS. 31F to 31I may be performed to complete the semiconductor package 2.

In general, to form a fan-out wafer level package, after the first redistribution layer 120 is formed on a carrier substrate (not shown), and the connecting pillar 260 is first formed on the first redistribution layer 120, the semiconductor chip 110 may be attached on the first redistribution layer 120, and the molding layer 150 and the second redistribution layer 180 may be formed. To form the connecting pillar 260, a method of forming an opening by performing an exposure process on a photoresist material layer and forming the connecting pillar 260 inside the opening may be used. However, as the target aspect ratio of the opening increases, there may be an issue in that a defect may occur in the opening forming process, such as not completely removing the photoresist layer from the bottom of the opening.

However, according to some example embodiments, the opening 620H having the stepped portion 620S may be formed, using the phase shift mask PM20, in the second photoresist material layer 620 having positive photosensitive properties, and the opening 620H may be filled with a conductive material such that the connecting pillar 260 may be formed. Accordingly, a defect in the process of forming the opening may be prevented. Thus, the connecting pillar 260 having a relatively small footprint, a relatively large height, and/or a relatively large aspect ratio may be formed.

In addition, the connecting pillar 260 may include the stepped portion 260S between the lower area 260P1 and the upper area 260P2, and the molding layer 150 may surround the sidewall of the connecting pillar 260. Thus, a contact area between the molding layer 150 and the connecting pillar 260 may be relatively large. Therefore, even if a crack occurs between the lower area 260P1 of the connecting pillar 260 and the molding layer 150 (for example, due to a difference in the coefficient of thermal expansion between the connecting pillar 260 and the molding layer 150) in the manufacturing process of the semiconductor package 2, the crack may not propagate to the upper area 260P2 of the connecting pillar 260. Accordingly, the semiconductor package 2 may have excellent reliability.

By way of summation and review, a fan-out wafer level package on-package (PoP) structure may be implemented with a connecting pillar that connects an upper redistribution layer to a lower redistribution layer. Increasing a chip thickness may help to improve heat dissipation characteristics of the package, and in such a structure the height of the connecting pillar may be increased. However, a manufacturing process may become more difficult if the connecting pillar has a relatively large height and a miniaturized footprint.

As described above, embodiments relate to a fan-out wafer level package type semiconductor package and a manufacturing method thereof.

Embodiments may provide a semiconductor package capable of preventing defects in a process of forming a connecting pillar having a large height and a miniaturized footprint.

Embodiments may provide a method of manufacturing a semiconductor package capable of preventing defects in a process of forming a connecting pillar having a large height and a miniaturized footprint.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first redistribution layer;
a first semiconductor chip disposed on the first redistribution layer;
a molding layer disposed on the first redistribution layer to cover a side surface of the first semiconductor chip;
a second redistribution layer disposed on the molding layer; and
a connecting pillar disposed to penetrate the molding layer and configured to connect the first redistribution layer to the second redistribution layer, the connecting pillar including:
a lower area having a first width in a first direction parallel to an upper surface of the first semiconductor chip, and
an upper area integrally connected to the lower area, and having a second width that is less than the first width in the first direction, wherein:
the connecting pillar has a first height in a second direction perpendicular to the upper surface of the first semiconductor chip,
the first height is about 100 micrometers to about 400 micrometers,
the first width of the lower area is about 50 micrometers to about 300 micrometers,
the lower area has a second height in the second direction, and
the second height is about 30% to about 70% of the first height.

2. The semiconductor package as claimed in claim 1, wherein:
the connecting pillar further includes a stepped portion defined between the lower area and the upper area, and
the molding layer covers an entirety of a sidewall of the lower area, the stepped portion, and a sidewall of the upper area.

3. The semiconductor package as claimed in claim 1, wherein the connecting pillar includes copper.

4. The semiconductor package as claimed in claim 1, wherein a ratio of the first height to the first width is about 0.5 to about 5.

5. The semiconductor package as claimed in claim 1, wherein:
the lower area includes a shoulder portion in an outer portion of the lower area, and
the shoulder portion is not covered by the upper area, and is in contact with the molding layer.

6. The semiconductor package as claimed in claim 1, wherein the lower area and the upper area have a circular or elliptical horizontal cross-section.

7. The semiconductor package as claimed in claim 1, wherein:
the lower area has a circular or elliptical horizontal cross-section, and
the upper area has an annular horizontal cross-section.

8. The semiconductor package as claimed in claim 1, wherein an external connection terminal on a lower surface of the first redistribution layer is arranged in a fan-out structure.

9. The semiconductor package as claimed in claim 1, wherein:
the connecting pillar further includes a middle area disposed between the lower area and the upper area, a first stepped portion is defined in an outer portion of the connecting pillar at a boundary between the lower area and the middle area,
a second stepped portion is defined in the outer portion of the connecting pillar at a boundary between the middle area and the upper area, and
the second stepped portion is disposed at a higher vertical level than the first stepped portion.

10. The semiconductor package as claimed in claim 9, wherein the lower area, the middle area, and the upper area have a circular or elliptical horizontal cross-section.

11. The semiconductor package as claimed in claim 9, wherein:
the lower area has a circular or elliptical horizontal cross-section, and
the middle area and the upper area have an annular horizontal cross-section.

12. A semiconductor package, comprising:
a first redistribution layer;
a first semiconductor chip disposed on the first redistribution layer;
a molding layer disposed on the first redistribution layer to cover a side surface of the first semiconductor chip;
a second redistribution layer disposed on the molding layer; and
a connecting pillar disposed to penetrate the molding layer and configured to connect the first redistribution layer to the second redistribution layer, the connecting pillar including an upper area and a lower area, wherein:
the connecting pillar further includes a middle area disposed between the lower area and the upper area,
a first stepped portion is defined in an outer portion of the connecting pillar at a boundary between the lower area and the middle area,
a second stepped portion is defined in the outer portion of the connecting pillar at a boundary between the middle area and the upper area, and
the second stepped portion is disposed at a higher vertical level than the first stepped portion.

13. The semiconductor package as claimed in claim 12, wherein:
the lower area has a first width in a first direction parallel to an upper surface of the first semiconductor chip, and
the upper area has a second width that is less than the first width in the first direction.

14. The semiconductor package as claimed in claim 12, wherein:
the lower area includes a shoulder portion in an outer portion of the lower area, and
the shoulder portion is not covered by the upper area, and is in contact with the molding layer.

15. The semiconductor package as claimed in claim 12, wherein:
the lower area has a first width in a first direction parallel to an upper surface of the first semiconductor chip, and
the upper area has a second width that is greater than the first width in the first direction.

16. The semiconductor package as claimed in claim 15, wherein an outer periphery of a bottom surface of the upper area is covered by the molding layer.

17. The semiconductor package as claimed in claim 15, wherein:
the connecting pillar has a first height in a second direction perpendicular to an upper surface of the first semiconductor chip, the first height is about 100 micrometers to about 400 micrometers, and the second width of the upper area is about 50 micrometers to about 300 micrometers.

18. A semiconductor package, comprising:

a first redistribution layer;

a first semiconductor chip disposed on the first redistribution layer;

a molding layer disposed on the first redistribution layer to cover a side surface of the first semiconductor chip;

a second redistribution layer disposed on the molding layer; and a connecting pillar disposed to penetrate the molding layer and configured to connect the first redistribution layer to the second redistribution layer, the connecting pillar including a first upper area, a second upper area and a lower area, wherein a stepped portion is defined in an outer portion of the connecting pillar at a boundary between the first and second upper areas and the lower area; and an external connection terminal disposed on a lower surface of the first redistribution layer, wherein the connecting pillar includes copper, wherein the first and second upper areas are disposed to be spaced apart from each other on the lower area, and wherein the molding layer covers sidewalls of the lower area and the first and second upper areas.

* * * * *